United States Patent
Lee et al.

(10) Patent No.: US 9,405,188 B2
(45) Date of Patent: Aug. 2, 2016

(54) POSITIVE PHOTOSENSITIVE RESIN COMPOSITION, PHOTOSENSITIVE RESIN FILM PREPARED BY USING THE SAME, AND DISPLAY DEVICE

(71) Applicant: SAMSUNG SDI CO., LTD., Yongin-si (KR)

(72) Inventors: Jong-Hwa Lee, Suwon-si (KR); Ji-Yun Kwon, Suwon-si (KR); Sang-Soo Kim, Suwon-si (KR); Kun-Bae Noh, Suwon-si (KR); Eun-Bi Park, Suwon-si (KR); Jae-Yeol Baek, Suwon-si (KR); Bum-Jin Lee, Suwon-si (KR); Sang-Haeng Lee, Suwon-si (KR); Eun-Ha Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 14/445,567

(22) Filed: Jul. 29, 2014

(65) Prior Publication Data

US 2015/0177617 A1  Jun. 25, 2015

(30) Foreign Application Priority Data

Dec. 19, 2013 (KR) .......................... 10-2013-0159304

(51) Int. Cl.
| | | |
|---|---|---|
| *G03F 7/023* | (2006.01) | |
| *C08G 73/10* | (2006.01) | |
| *C08G 73/22* | (2006.01) | |
| *G03F 7/022* | (2006.01) | |
| *G03F 7/075* | (2006.01) | |

(52) U.S. Cl.
CPC ............ *G03F 7/0226* (2013.01); *G03F 7/0233* (2013.01); *G03F 7/0758* (2013.01); *C08G 73/10* (2013.01); *C08G 73/22* (2013.01)

(58) Field of Classification Search
CPC ..... G03F 7/0226; G03F 7/0233; C08G 73/10; C08G 73/22
USPC ............ 430/18, 191, 192, 193; 528/335, 353
See application file for complete search history.

(56) References Cited

U.S. PATENT DOCUMENTS

| | | | |
|---|---|---|---|
| 4,927,736 A | 5/1990 | Mueller et al. | |
| 7,851,121 B2 * | 12/2010 | Yamanaka et al. | ............ 430/191 |
| 8,298,747 B2 | 10/2012 | Minegishi et al. | |
| 2004/0126696 A1 * | 7/2004 | Inomata et al. | ............ 430/270.1 |
| 2005/0153238 A1 | 7/2005 | Honda et al. | |
| 2010/0092879 A1 * | 4/2010 | Minegishi et al. | ............. 430/18 |
| 2013/0168859 A1 * | 7/2013 | Tanimoto et al. | ............. 257/738 |
| 2014/0014928 A1 * | 1/2014 | Okumura et al. | ............... 257/40 |
| 2014/0349222 A1 * | 11/2014 | Shibui et al. | .................... 430/18 |

FOREIGN PATENT DOCUMENTS

| | | |
|---|---|---|
| CN | 102439520 A | 5/2012 |
| EP | 0424940 A2 | 5/1991 |
| JP | 64-060630 A | 3/1989 |
| JP | 03-209478 A | 9/1991 |
| JP | 2002-169277 A | 6/2002 |
| JP | 2005-196130 A | 7/2005 |
| KR | 10-2009-0129403 A | 12/2009 |

OTHER PUBLICATIONS

Search Report in counterpart Taiwanese Application No. 103127850 dated Apr. 29, 2015, pp. 1.

* cited by examiner

*Primary Examiner* — John S Chu
(74) *Attorney, Agent, or Firm* — Additon, Higgins & Pendleton, P.A.

(57) ABSTRACT

Disclosed is a positive photosensitive resin composition including (A) an alkali soluble resin; (B) a photosensitive diazoquinone compound; (C) a cross-linking agent; (D) a thermal acid generator; (E) a phenol compound; and (F) an organic solvent, wherein the cross-linking agent and thermal acid generator are included in a weight ratio of about 1:50 to about 50:1.

9 Claims, 5 Drawing Sheets

POSITIVE PHOTOSENSITIVE RESIN COMPOSITION, PHOTOSENSITIVE RESIN FILM PREPARED BY USING THE SAME, AND DISPLAY DEVICE

CROSS-REFERENCE TO RELATED APPLICATION

This application claims priority to and the benefit of Korean Patent Application No. 10-2013-0159304 filed in the Korean Intellectual Property Office on Dec. 19, 2013, the entire disclosure of which is incorporated herein by reference.

FIELD OF THE INVENTION

This disclosure relates to a positive photosensitive resin composition, a photosensitive resin film using the same, and a display device including the photosensitive resin film.

BACKGROUND

Heat resistant resins such as polyimides, polybenzoxazoles, and the like have been widely used as an interlayer insulating layer and/or a planarization layer for a display device such as an organic light emitting diode (OLED), liquid crystal display (LCD), and the like. In particular, a heat resistant photosensitive polyimide and photosensitive polybenzoxazole have recently been used to form an interlayer insulating layer and the like in an OLED in order to secure reliability of the OLED.

The photosensitive polyimide and polybenzoxazole can have excellent physical characteristics such as heat resistance, mechanical strength and the like, excellent electrical characteristics such as a low dielectric constant, a high insulation property, and the like, good planarization characteristics on a coating surface, include small amounts of impurities that can deteriorate reliability of a device, and easily form a fine shape. In particular, positive-type photosensitive polyimides and polybenzoxazoles may be used in a pattern process and the like and can have pattern accuracy applicable to pattern an insulation layer and a planarization layer for an organic light emitting diode and thus, are very advantageous in terms of processability, economics, and the like.

The organic light emitting diode has been spotlighted as a next-generation display due to self-emission, a wide viewing angle, and a thin film type but in general has a drawback of a short life-span due to rapid aging by moisture and the like. In order to overcome this drawback, a method of stopping moisture and out gas from a chemical material and the like used in a manufacturing process as well as the manufacturing process itself has been adopted.

In particular, the organic light emitting diode may have a problem of a pattern collapse during thermal curing, when a fine structure such as an insulation layer, a planarization layer, and the like is formed. Accordingly, there is a need for a photosensitive resin film 1) having a cross section of a forward taper shape, 2) maintaining a pattern shape even during curing, 3) being heated and baked at 250° C. or a lower temperature, 4) generating out gas in a small amount after the heating and baking, and 5) having excellent heat and chemical resistance and the like.

SUMMARY

One embodiment of the present invention provides a positive photosensitive resin composition capable of being baked at a low temperature, generating little out gas from a resin film after heating and baking, maintaining a pattern shape during curing, and having excellent heat resistance.

Another embodiment provides a photosensitive resin film using the positive photosensitive resin composition.

Yet another embodiment provides a display device including the photosensitive resin film.

One embodiment provides a positive photosensitive resin composition that includes (A) an alkali soluble resin; (B) a photosensitive diazoquinone compound; (C) a cross-linking agent; (D) a thermal acid generator; (E) a phenol compound; and (F) an organic solvent, wherein the cross-linking agent and thermal acid generator are included in a weight ratio of about 1:50 to about 50:1.

The cross-linking agent and thermal acid generator may be included in a weight ratio of about 5:20 to about 20:5.

The cross-linking agent may be a melamine-based cross-linking agent, a methylol-based cross-linking agent, or a combination thereof.

The alkali soluble resin may be a polybenzoxazole precursor, a polyimide precursor, or a combination thereof.

The polybenzoxazole precursor may include a structure unit represented by the following Chemical Formula 1, and the polyimide precursor may include a structure unit represented by the following Chemical Formula 2.

[Chemical Formula 1]

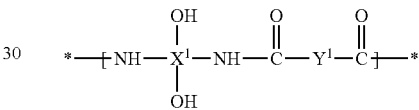

[Chemical Formula 2]

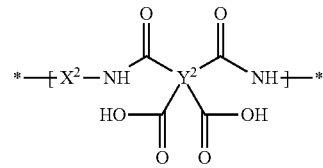

In the above Chemical Formulae 1 and 2, each $X^1$ is the same or different and each is independently a substituted or unsubstituted C6 to C30 aromatic organic group, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

The thermal acid generator may have a decomposition temperature of about 120° C. to about 200° C.

The positive photosensitive resin composition may include about 5 to about 100 parts by weight of the photosensitive diazoquinone compound (B); about 1 to about 50 parts by weight of the cross-linking agent (C); about 1 to about 50 parts by weight of the thermal acid generator (D); and about 1 to about 50 parts by weight of the phenol compound (E) based on 100 parts by weight of the alkali soluble resin (A), and about 3 wt % to about 30 wt % of the organic solvent (F) based on the total solid amount of the positive photosensitive resin composition.

The positive photosensitive resin composition may include an additive selected from a surfactant, a leveling agent, a silane coupling agent, and a combination thereof.

Another embodiment provides a photosensitive resin film formed using the positive photosensitive resin composition.

Yet another embodiment provides a display device including the photosensitive resin film.

A positive photosensitive resin composition according to one embodiment of the present invention may provide a photosensitive resin film capable of being cured at a low temperature, maintaining a forward taper shape without a pattern collapse during thermal curing, generating little out gas from a coating layer after heating and baking, and having excellent heat and chemical resistance. In addition, the photosensitive resin film may have neither performance deterioration due to out gas nor a luminous defect such as a dark spot, pixel shrinkage, or the like.

DETAILED DESCRIPTION

Figure 1:
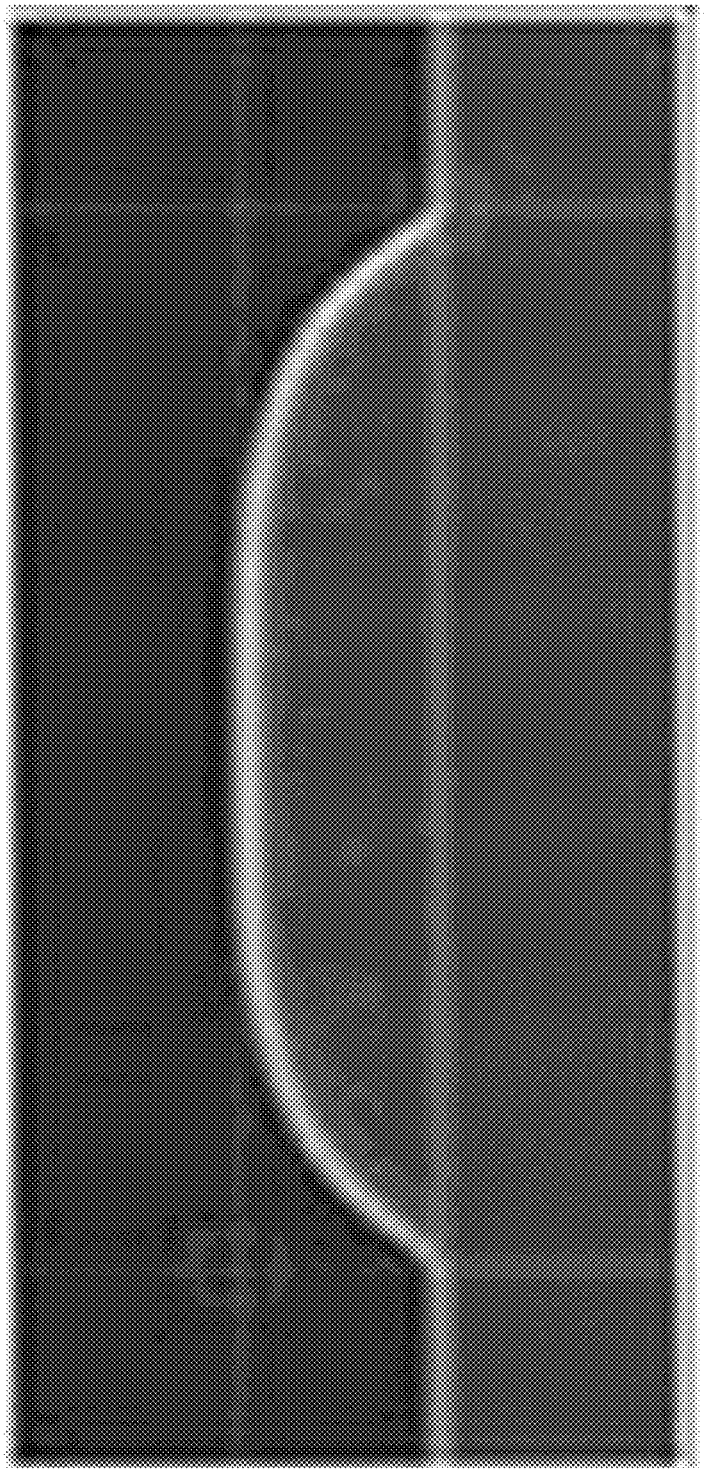
FIGS. 1 to 4 are photographs showing a pattern shape of each composition according to Examples 1, 2, 3 and 16, respectively.
Figure 2:
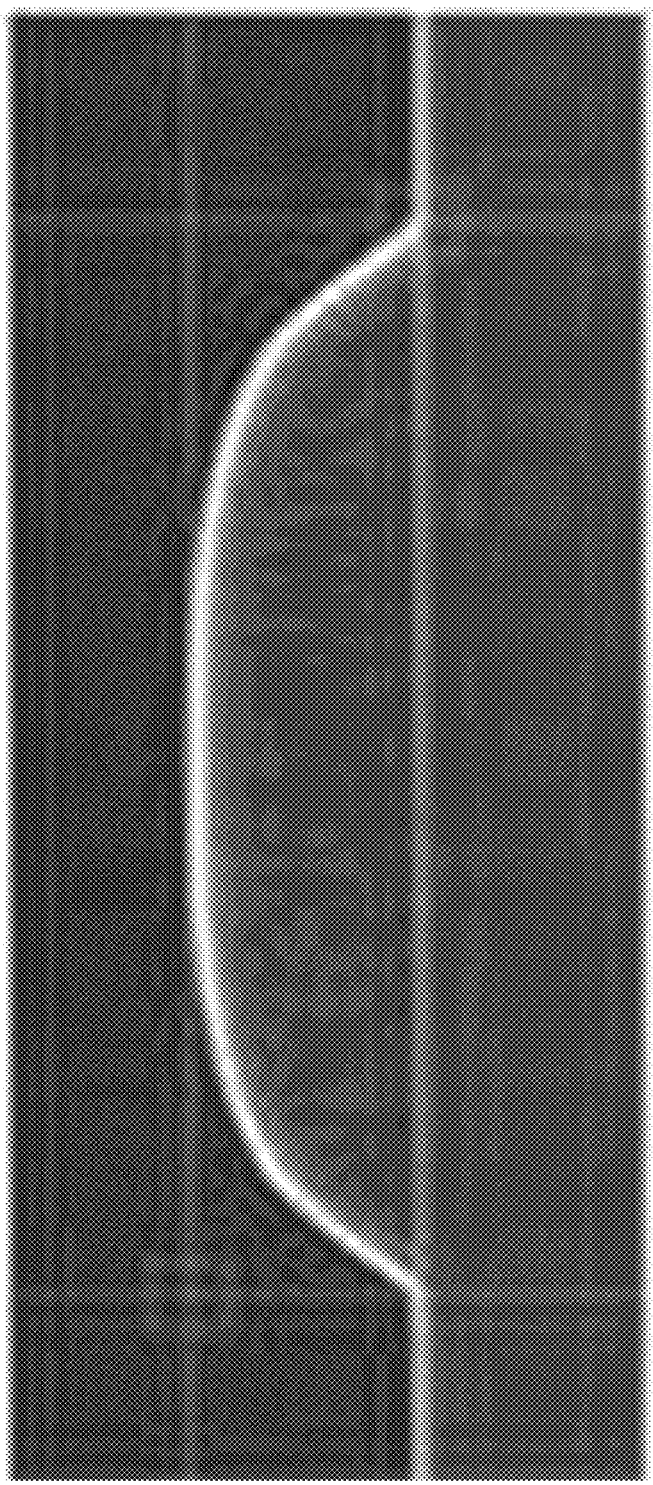
Figure 3:
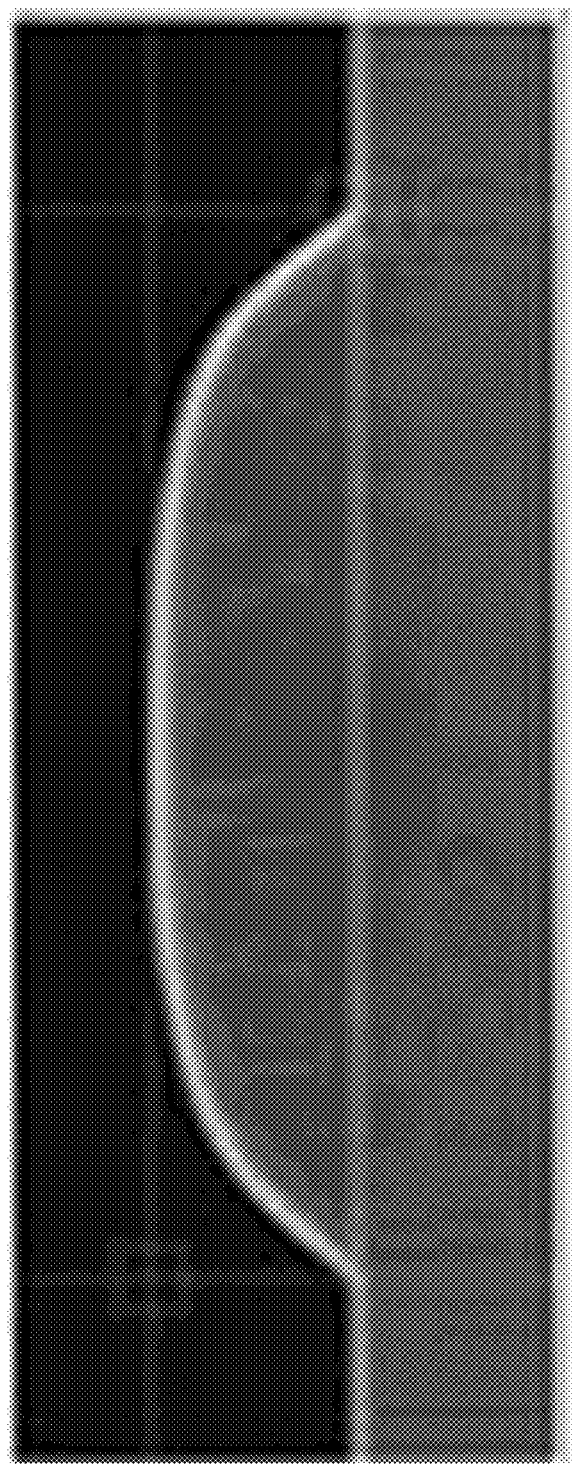
Figure 4:
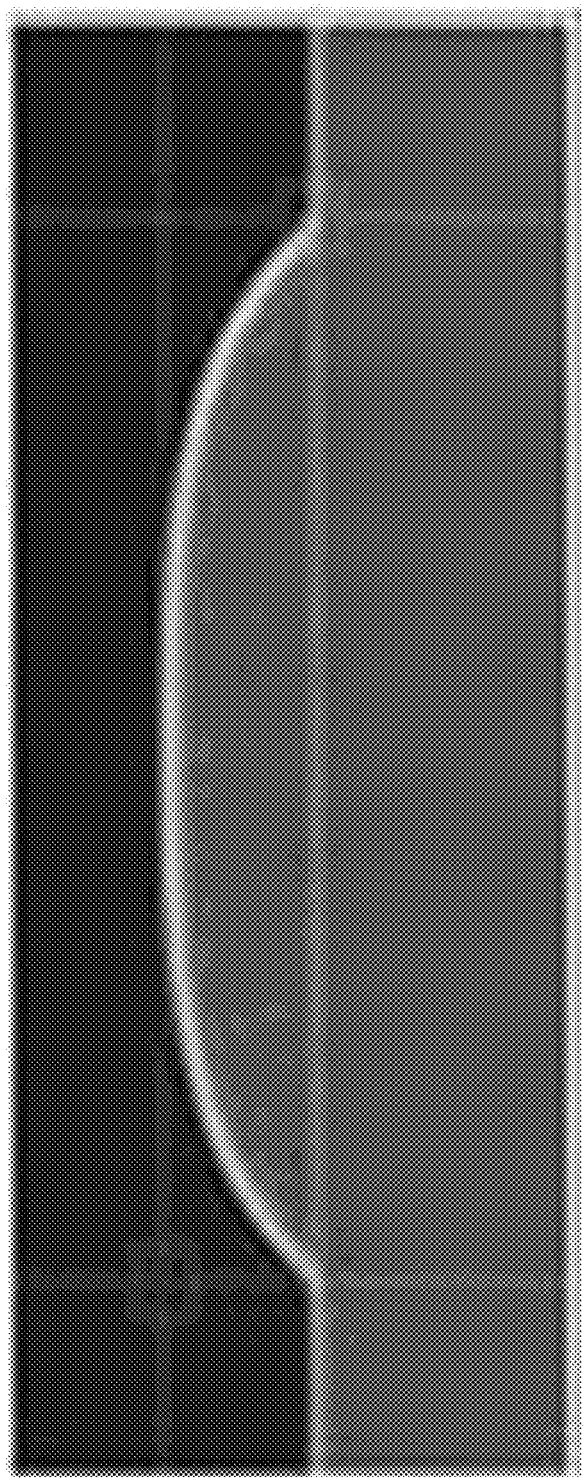
Figure 5:
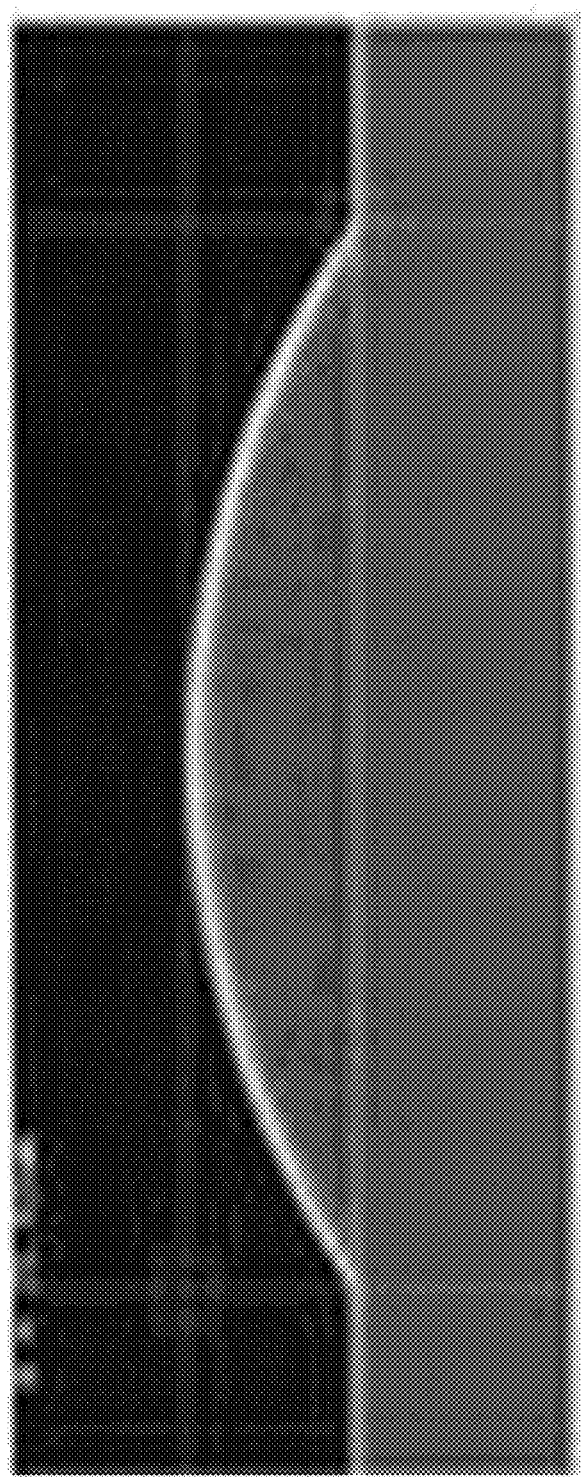
FIG. 5 is a photograph showing a pattern shape of a composition according to Comparative Example 1.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least one or more substituents including halogen (F, Br, Cl or I), a hydroxy group, a nitro group, a cyano group, an amino group ($NH_2$, $NH(R^{200})$ or $N(R^{201})(R^{202})$, wherein $R^{200}$, $R^{201}$ and $R^{202}$ are the same or different and are each independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, a substituted or unsubstituted heterocyclic group, or a combination thereof, instead of a functional group of the present invention.

As used herein, when a specific definition is not otherwise provided, the term "alkyl" refers to C1 to C30 alkyl, for example C1 to C15 alkyl, the term "cycloalkyl" refers to C3 to C30 cycloalkyl, for example C3 to C18 cycloalkyl, the term "alkoxy group" refers to a C1 to C30 alkoxy group, for example a C1 to C18 alkoxy group, the term "aryl" refers to C6 to C30 aryl, for example C6 to C18 aryl, the term "alkenyl" refers to C2 to C30 alkenyl, for example C2 to C18 alkenyl, the term "alkylene" refers to C1 to C30 alkylene, for example C1 to C18 alkylene, and the term "arylene" refers to C6 to C30 arylene, for example C6 to C16 arylene.

As used herein, when a specific definition is not otherwise provided, the term "aliphatic organic group" refers to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" refers to C6 to C30 aryl or C6 to C30 arylene, for example C6 to C16 aryl or C6 to C16 arylene, the term "heterocyclic group" refers to C2 to C30 cycloalkyl, C2 to C30 cycloalkylene, C2 to C30 cycloalkenyl, C2 to C30 cycloalkenylene, C2 to C30 cycloalkynyl, C2 to C30 cycloalkynylene, C2 to C30 heteroaryl, or C2 to C30 heteroarylene that include 1 to 3 hetero atoms including O, S, N, P, Si, or a combination thereof in a ring, for example C2 to C15 cycloalkyl, C2 to C15 cycloalkylene, C2 to C15 cycloalkenyl, C2 to C15 cycloalkenylene, C2 to C15 cycloalkynyl, C2 to C15 cycloalkynylene, C2 to C15 heteroaryl, or C2 to C15 heteroarylene that include 1 to 3 hetero atoms including O, S, N, P, Si, or a combination thereof in a ring.

As used herein, when a definition is not otherwise provided, the term "combination" refers to mixing and/or copolymerization. In addition, the term "copolymerization" refers to block copolymerization and/or random copolymerization, and the term "copolymer" refers to a block copolymer and/or a random copolymer.

As used herein, unless a specific definition is not otherwise provided, a hydrogen atom is bonded at the position when a chemical bond is not drawn where a bond would otherwise appear.

Also, "*" refers to a linking part between the same or different atoms, or chemical formulae.

A positive photosensitive resin composition according to one embodiment includes (A) an alkali soluble resin; (B) a photosensitive diazoquinone compound; (C) a cross-linking agent; (D) a thermal acid generator; (E) a phenol compound; and (F) an organic solvent, wherein the cross-linking agent and thermal acid generator are included in a weight ratio of about 1:50 to about 50:1.

The cross-linking agent and thermal acid generator may be included in a weight ratio of about 5:20 to about 20:5.

In a process of manufacturing an insulation layer, a planarization layer, and the like in an organic EL device, a conventional photosensitive resin film may not maintain an original pattern due to heat during thermal curing but may mostly flow down. However, the positive photosensitive resin composition according to one embodiment includes a cross-linking agent and thus may control the pattern flow-down due to a cross-linking reaction between the cross-linking agent and the alkali soluble resin by heat during thermal curing. In addition, the positive photosensitive resin composition according to one embodiment may further include a thermal acid generator, which can act as a catalyst for the linking reaction and can more effectively control the pattern flow-down.

When the cross-linking agent and the thermal acid generator are included in an amount within the above weight ratio, the thermal acid generator may more effectively catalyze the cross-linking reaction, so that the cross-linking agent and the alkali soluble resin may be more quickly cross-linked at a lower temperature. This can provide a photosensitive resin film maintaining a forward taper shape without a pattern collapse during thermal curing, minimize the amount of out gas from a coating layer, and increase heat resistance.

When the cross-linking agent and the thermal acid generator are used in an amount outside of the about weight ratio range, the above effect may not be obtained. Specifically, when the mixing ratio is smaller than 1, the cross-linking agent and the alkali soluble resin may not be well cross-linked during curing and may cause a pattern to reflow, while when the mixing ratio is greater than 50, a coating layer may be brittle and thus, broken or stripped after the curing.

Hereinafter, each component of the positive photosensitive resin composition is described in detail.

(C) Cross-Linking Agent

The positive photosensitive resin composition according to the embodiment may form a cross-linking structure through a reaction of the cross-linking agent with the alkali soluble resin when a photosensitive resin film is baked after forming a pattern. The positive photosensitive resin composition can further include a thermal acid generator, which catalyzes the cross-linking structure formation of the cross-linking agent. Accordingly, the resin composition may be cured even at a low temperature of less than or equal to 250° C., may be more actively cross-linked, and can increase heat resistance and chemical resistance of a baked photosensitive resin film. In addition, less out gas may be generated from the photosensitive resin film after heating and baking, and thus, formation of a dark spot in the photosensitive resin film can be suppressed. Furthermore, a shrinkage rate of the photosensitive resin film after the curing may be sharply decreased.

The cross-linking agent may be a melamine-based cross-linking agent, a methylol-based cross-linking agent, or a combination thereof.

The melamine-based cross-linking agent may be represented by the following Chemical Formula 61 and/or Chemical Formula 62.

[Chemical Formula 61]

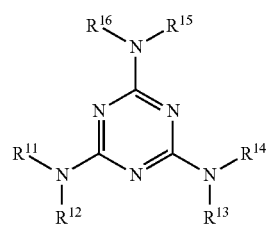

[Chemical Formula 62]

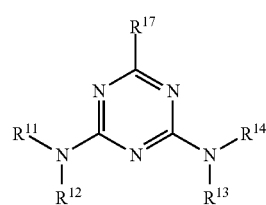

In the above Chemical Formulae 61 and 62, $R^{11}$ to $R^{16}$ are the same or different and each are independently hydrogen or —$CH_2OR^{18}$, wherein $R^{18}$ is hydrogen or substituted or unsubstituted C1 to C6 alkyl, provided at least one of $R^{11}$ to $R^{16}$ is —$CH_2OR^{18}$, and $R^{17}$ is substituted or unsubstituted C1 to C20 alkyl, substituted or unsubstituted C6 to C20 aryl or substituted or unsubstituted C3 to C20 cycloalkyl.

The $R^{17}$ may be substituted or unsubstituted C1 to C10 alkyl, substituted or unsubstituted C6 to C14 aryl or substituted or unsubstituted C3 to C10 cycloalkyl.

Examples of the melamine-based cross-linking agent may include without limitation methoxymethylmelamine compounds, alkoxyalkylmelamine compounds such as hexamethoxymethylmelamine compounds, alkoxyalkylmethanolmelamine compounds, carboxylmethylmelamine compounds, melamine-based compounds having a hydroxymethylamino group, and the like, and combinations thereof.

The melamine-based cross-linking agent may be represented by one or more of the following Chemical Formulae 63 to 70.

[Chemical Formula 63]

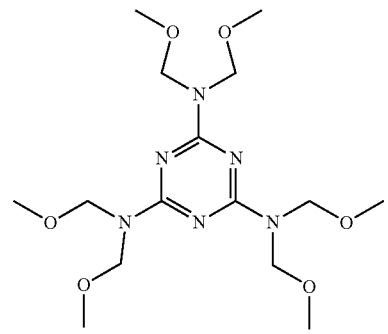

[Chemical Formula 64]

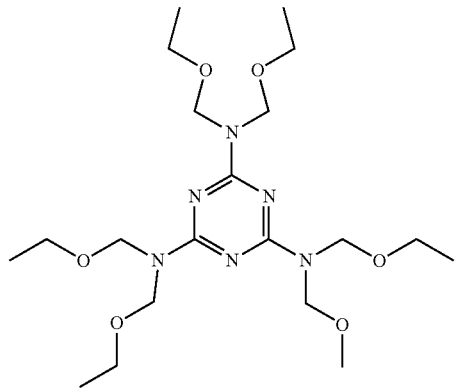

[Chemical Formula 65]

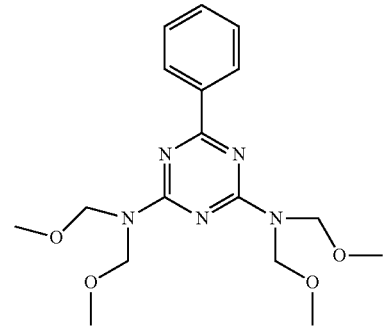

[Chemical Formula 66]

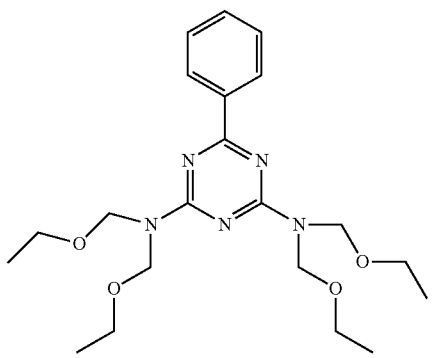

[Chemical Formula 67]

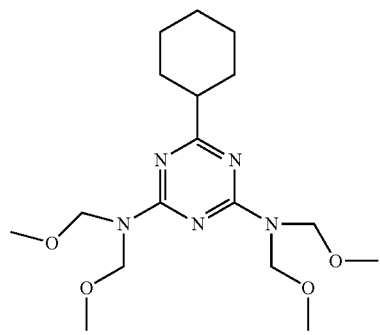

[Chemical Formula 68]

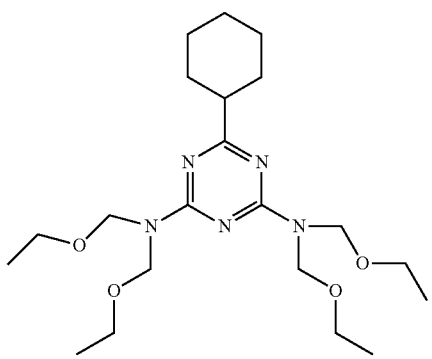

[Chemical Formula 69]

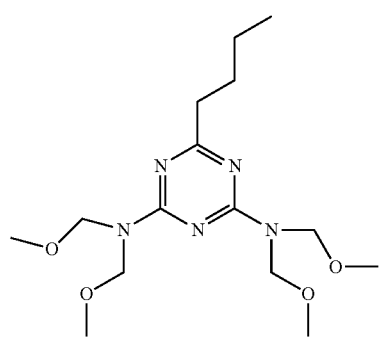

[Chemical Formula 70]

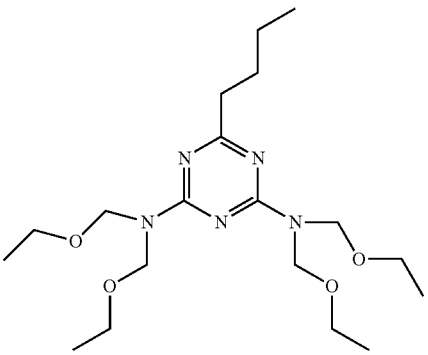

The positive photosensitive resin composition may include the melamine-based cross-linking agent in an amount of about 1 to about 50 parts by weight, based on about 100 parts by weight of the alkali soluble resin. In some embodiments, the positive photosensitive resin composition may include the melamine-based cross-linking agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the melamine-based cross-linking agent can be in a range from about any of the foregoing amounts to about any other of the foregoing amounts.

When the melamine-based cross-linking agent is used in an amount of greater than or equal to 1 part by weight based on about 100 parts by weight of the alkali soluble resin, the melamine-based cross-linking agent may increase alkali resistance of the alkali soluble resin and thus, a film residue ratio in a non-exposed region and accordingly, can be used in an amount of less than or equal to 50 parts by weight to facilitate a development process. When the melamine-based cross-linking agent is used in an amount of less than about 1 part by weight based on about 100 parts by weight of the alkali soluble resin, photo-speed may be deteriorated, it may be difficult to maintain a pattern shape during baking, and the amount of out gas may be increased. In addition, when the melamine-based cross-linking agent is used in an amount of greater than about 50 parts by weight, storage stability may be deteriorated, and the amount of out gas may be increased due to the non-reacted melamine-based cross-linking agent.

The methylol-based cross-linking agent includes a methylol group, a phenolic hydroxy group, or a combination thereof and may increase a cross-linking effect when used with a post-described thermal acid generator. Accordingly, an alkali soluble resin film may have much more excellent heat resistance, and the amount of out gas may be sharply decreased.

In addition, the methylol-based cross-linking agent may play a role of a dissolution controlling agent of increasing a dissolution rate in an exposure region during development with an alkali aqueous solution and thus, improving sensitivity as well as a role of a cross-linking agent. In other words, the methylol-based cross-linking agent may play a role of a cross-linking agent during baking after forming a pattern but also a role of a dissolution controlling agent during exposure and development after forming a coating layer.

The methylol-based cross-linking agent may be, for example, represented by one or more of the following Chemical Formulae 71 to 110.

[Chemical Formula 71]
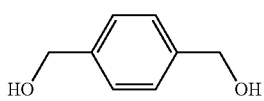
[Chemical Formula 72]
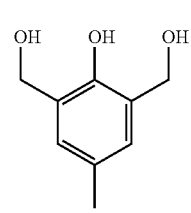
[Chemical Formula 73]
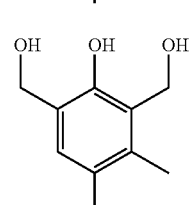
[Chemical Formula 74]
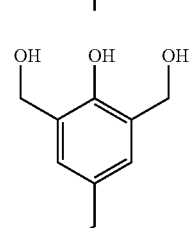
[Chemical Formula 75]
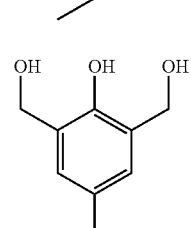
[Chemical Formula 76]
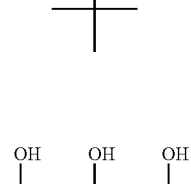
[Chemical Formula 77]
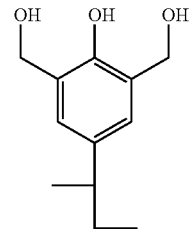
-continued
[Chemical Formula 78]
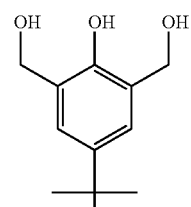
[Chemical Formula 79]
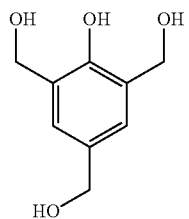
[Chemical Formula 80]
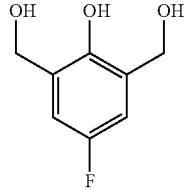
[Chemical Formula 81]
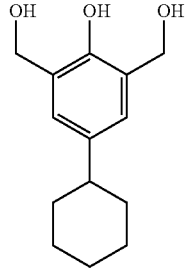
[Chemical Formula 82]
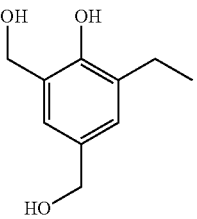
[Chemical Formula 83]
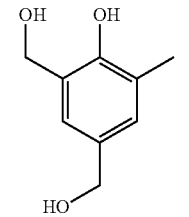
[Chemical Formula 84]
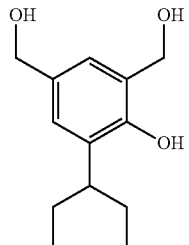

[Chemical Formula 85]
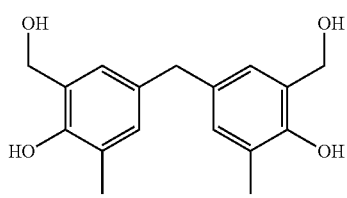
[Chemical Formula 86]
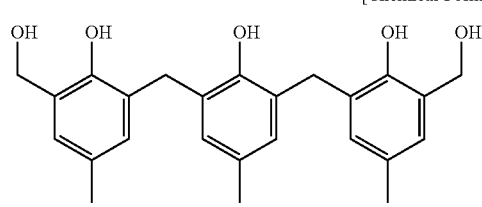
[Chemical Formula 87]
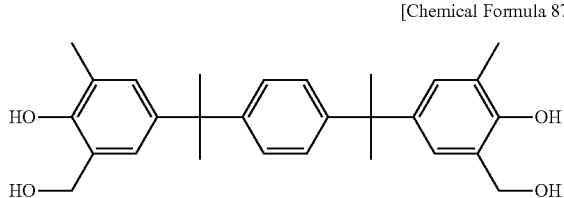
[Chemical Formula 88]
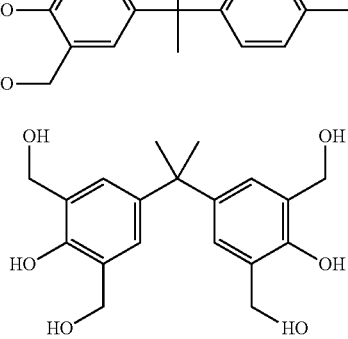
[Chemical Formula 89]
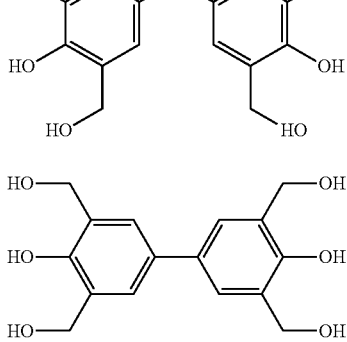
[Chemical Formula 90]
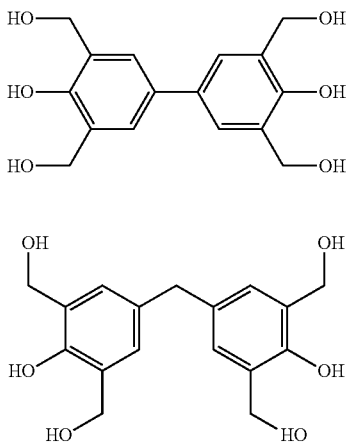
[Chemical Formula 91]
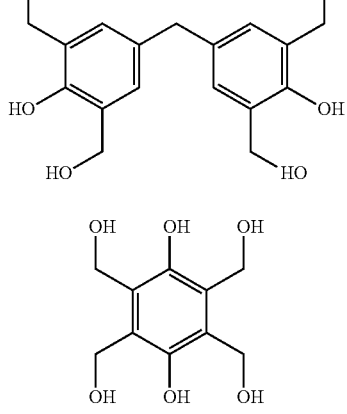
[Chemical Formula 92]
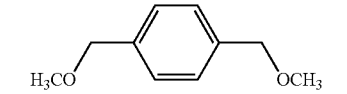
[Chemical Formula 93]
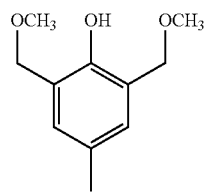
[Chemical Formula 94]
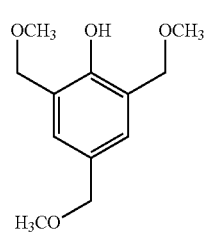
[Chemical Formula 95]
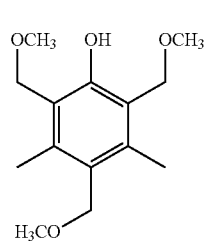
[Chemical Formula 96]
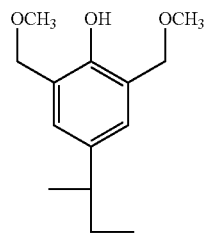
[Chemical Formula 97]
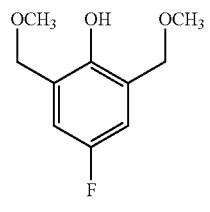
[Chemical Formula 98]
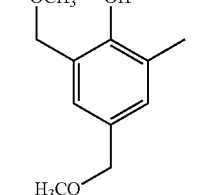
[Chemical Formula 99]
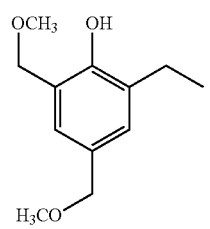

[Chemical Formula 100]
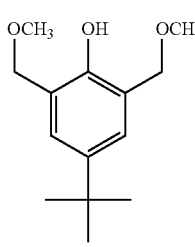

[Chemical Formula 101]
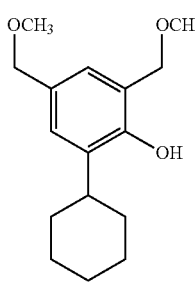

[Chemical Formula 102]
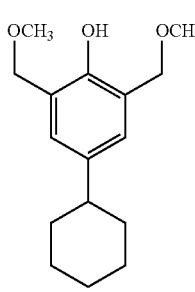

[Chemical Formula 103]
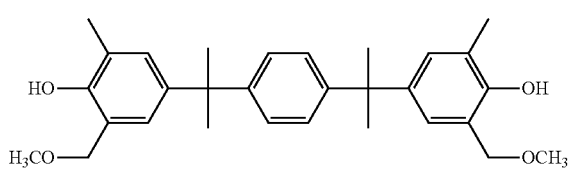

[Chemical Formula 104]
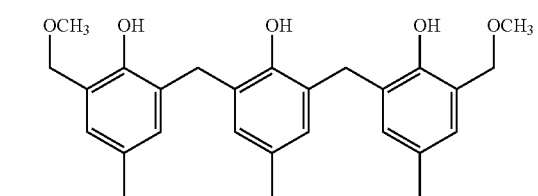

[Chemical Formula 105]
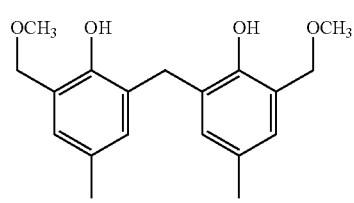

[Chemical Formula 106]
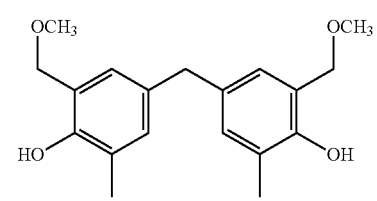

[Chemical Formula 107]
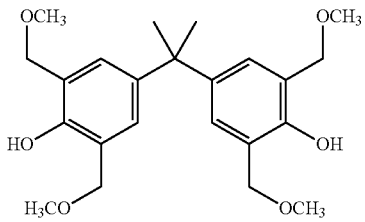

[Chemical Formula 108]
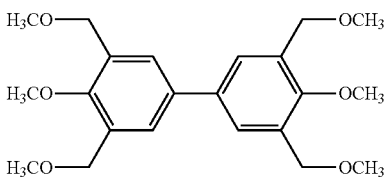

[Chemical Formula 109]
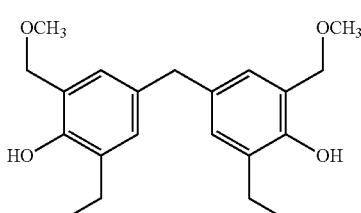

[Chemical Formula 110]
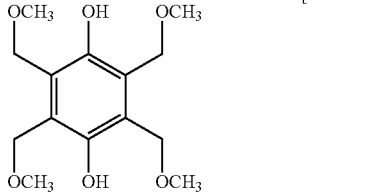

The positive photosensitive resin composition may include the methylol-based cross-linking agent in an amount of about 1 to about 50 parts by weight based on about 100 parts by weight of the alkali soluble resin. In some embodiments, the positive photosensitive resin composition may include the methylol-based cross-linking agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the methylol-based cross-linking agent can be in a range from about any of the foregoing amounts to about any other of the foregoing amounts.

When the methylol-based cross-linking agent is included in an amount of greater than or equal to about 1 part by weight based on about 100 parts by weight of the alkali soluble resin, coating property may be excellent, while when the methylol-based cross-linking agent is included in an amount of less than or equal to about 50 parts by weight, developability and sensitivity can be improved. However, when the methylol-based cross-linking agent is used in an amount of less than or equal to about 1 part by weight based on about 100 parts by weight of the alkali soluble resin, a cross-linking effect during curing may be insignificant, while when the methylol-based cross-linking agent is used in an amount of greater than about 50 parts by weight, the amount of out gas may be increased.

(D) Thermal Acid Generator

A thermal acid generator used in a positive photosensitive resin composition according to the embodiment is a material thermally decomposed and generating acid and may include a conventional thermal acid generator and have a thermal decomposition temperature ranging from about 120° C. to about 200° C.

When the thermal acid generator has a thermal decomposition temperature within the above range, a scum may not be generated at all, a pattern shape may not flow down during thermal curing, and the amount of out gas may be decreased. In addition, the thermal acid generator may smooth the ring-closure reaction of the alkali soluble resin and thus can improve reliability such as heat resistance, insulation property, and the like.

The thermal acid generator may play a role of smoothing the ring-closure reaction of the alkali soluble resin even at a low temperature as well as catalyze a cross-linking reaction between the cross-linking agent and the alkali soluble resin. Accordingly, a photosensitive resin film generating out gas in a small amount despite baking at a low temperature and having excellent heat and chemical resistances may be obtained.

The thermal acid generator may be, for example a compound represented by the following Chemical Formula 36, Chemical Formula 37 or a combination thereof.

[Chemical Formula 36]

$$R^1-\underset{\underset{O}{\|}}{\overset{\overset{O}{\|}}{S}}-O-R^2$$

[Chemical Formula 37]

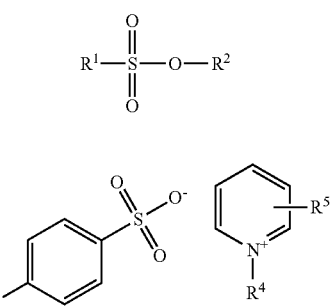

In the above Chemical Formulae 36 and 37, $R^1$ is hydrogen, a substituted or unsubstituted C1 to C30 alkoxy group, substituted or unsubstituted C6 to C30 aryl, or a combination thereof, $R^2$ is hydrogen, substituted or unsubstituted C1 to C30 alkyl, substituted or unsubstituted C2 to C30 alkenyl, substituted or unsubstituted C1 to C30 alkynyl, or a combination thereof, $R^3$ is hydrogen, substituted or unsubstituted C1 to C30 alkyl, a substituted or unsubstituted C1 to C30 alkoxy group, or a combination thereof, $R^4$ is hydrogen, substituted or unsubstituted C1 to C30 alkyl, or a combination thereof, and $R^5$ is hydrogen, halogen, substituted or unsubstituted C1 to C30 alkyl, or a combination thereof.

The above Chemical Formula 36 may be represented by one or more of the following Chemical Formulae 36a to 36c.

[Chemical Formula 36a]

$$Z_1\text{—}(CH_2)_{m1}\text{—}\underset{O}{\overset{O}{\underset{\|}{\overset{\|}{S}}}}\text{—}O\text{—}(CH_2)_{m2}\text{—}Z_2$$

[Chemical Formula 36b]

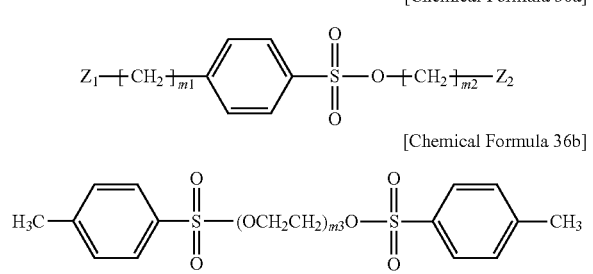

[Chemical Formula 36c]

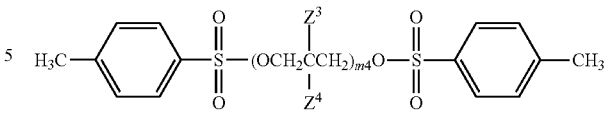

In the above Chemical Formulae 36a to 36c,
m1 to m4 are the same or different and are each independently integers ranging from 0 to 10, for example 0 to 6, and
$Z_1$ to $Z^4$ are the same or different and are each independently hydrogen, halogen, a hydroxy group, substituted or unsubstituted C1 to C30 alkyl, substituted or unsubstituted C2 to C30 alkenyl, substituted or unsubstituted C1 to C30 alkynyl, a substituted or unsubstituted C1 to C30 alkoxy group, substituted or unsubstituted C6 to C30 aryl, or a combination thereof.

The above Chemical Formulae 36 and 37 may be represented by one or more of the following Chemical Formulae 38 to 44.

[Chemical Formula 38]

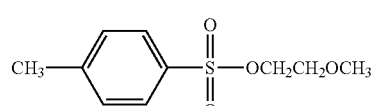

[Chemical Formula 39]

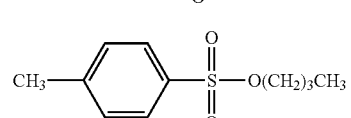

[Chemical Formula 40]

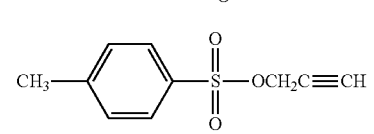

[Chemical Formula 41]

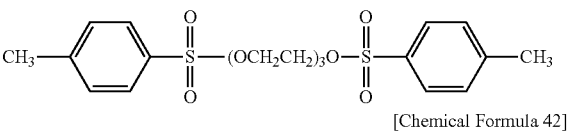

[Chemical Formula 42]

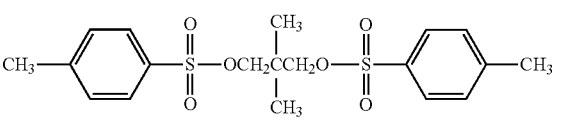

[Chemical Formula 43]

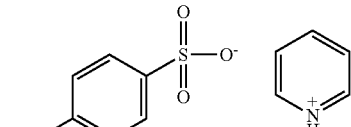

[Chemical Formula 44]

One or more of the compounds represented by the following Chemical Formulae 45 to 48 may be used as a thermal acid generator.

[Chemical Formula 45]

(structure: cyclohexane with OH and O-S(=O)₂-CF₃ substituents)

[Chemical Formula 46]

(structure: cyclopentane with OH and O-S(=O)₂-CF₃ substituents)

[Chemical Formula 47]

(structure: cyclohexane with OH and O-S(=O)₂-C₆H₄-CH₃ substituents)

[Chemical Formula 48]

(structure: cyclopentane with OH and O-S(=O)₂-C₆H₄-CH₃ substituents)

The positive photosensitive resin composition may include the thermal acid generator in an amount of about 1 to about 50 parts by weight, for example about 3 to about 30 parts by weight, based on about 100 parts by weight of the alkali soluble resin. In some embodiments, the positive photosensitive resin composition may include the thermal acid generator in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the thermal acid generator can be in a range from about any of the foregoing amounts to about any other of the foregoing amounts.

When the thermal acid generator is included in an amount within the above range, the alkali soluble resin may have sufficient ring closure and thus, excellent thermal and mechanical characteristics and also, excellent storage stability and sensitivity.

The thermal acid generator may be selected depending on a curing temperature and used singly or as a mixture of two or more.

Allylsulfonic acid such as p-toluene sulfonic acid, benzenesulfonic acid, perfluoroalkyl sulfonic acid such as trifluoromethanesulfonic acid, fluorobutanesulfonic acid, and alkyl sulfonic acid such as methane sulfonic acid, ethane sulfonic acid, and butane sulfonic acid may be also used, singly or in combination, in addition to or as an alternative to the thermal acid generator.

(A) Alkali Soluble Resin

The alkali soluble resin may be a polybenzoxazole precursor, a polyimide precursor, or a combination thereof.

The polybenzoxazole precursor may include a structure unit represented by the following Chemical Formula 1, and the polyimide precursor may include a structure unit represented by the following Chemical Formula 2.

[Chemical Formula 1]

$$*\mathbin{-\!\!\!\!+}NH\mathbin{-}\underset{\underset{OH}{|}}{\overset{\overset{OH}{|}}{X^1}}\mathbin{-}NH\mathbin{-}\overset{O}{\underset{\|}{C}}\mathbin{-}Y^1\mathbin{-}\overset{O}{\underset{\|}{C}}\mathbin{\!\!\!\!+\!-}*$$

In the above Chemical Formula 1, each $X^1$ is the same or different and each is independently a substituted or unsubstituted C6 to C30 aromatic organic group, and each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 2]

$$*\mathbin{-\!\!\!\!+}X^2\mathbin{-}NH\overset{O}{\underset{\|}{C}}\overset{}{\underset{\underset{HO-\overset{}{\underset{\|}{C}}}{Y^2}}{}}\overset{O}{\underset{\|}{C}}\mathbin{-}NH\mathbin{\!\!\!\!+}*$$

In the above Chemical Formula 2, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

In the above Chemical Formula 1, $X^1$ may be an aromatic organic group, and may be a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl) hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl) hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl) hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4- hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethyl phenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X^1$ may be a functional group represented by the following Chemical Formulae 3 and/or 4, but is not limited thereto.

[Chemical Formula 3]

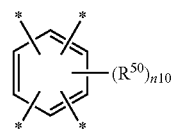

[Chemical Formula 4]

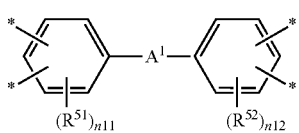

In the above Chemical Formulae 3 and 4, $A^1$ is a single bond, O, CO, $CR^{47}R^{48}$, $SO_2$ or S, wherein $R^{47}$ and $R^{48}$ are the same or different and are each independently hydrogen or substituted or unsubstituted C1 to C30 alkyl, for example C1 to C30 fluoroalkyl, $R^{50}$ to $R^{52}$ are the same or different and are each independently hydrogen, substituted or unsubstituted C1 to C30 alkyl, a substituted or unsubstituted C1 to C30 carboxyl group, a hydroxy group, or a thiol group, n10 is an integer of 0 to 2, and n11 and n12 are the same or different and are each independently an integer of 0 to 3.

In the above Chemical Formula 1, $Y^1$ may be an aromatic organic group, divalent to hexavalent aliphatic organic group, or a divalent to hexavalent alicyclic organic group, and may be a residual group of dicarboxylic acid or a residual group of a dicarboxylic acid derivative. For example, $Y^1$ may be an aromatic organic group or a divalent to hexavalent alicyclic organic group.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

Examples of $Y^1$ may be a functional group represented by the following Chemical Formulae 5 to 7, but are not limited thereto.

[Chemical Formula 5]

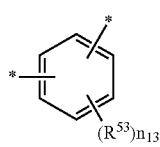

[Chemical Formula 6]

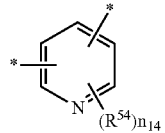

[Chemical Formula 7]

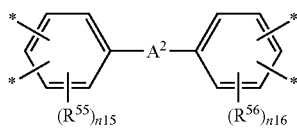

In the above Chemical Formulae 5 to 7, $R^{53}$ to $R^{56}$ are the same or different and are each independently hydrogen or substituted or unsubstituted C1 to C30 alkyl, n13 and n14 are the same or different and are each independently integers of 0 to 4, n15 and n16 are the same or different and are each independently integers of 0 to 3, and $A^2$ is a single bond, O, $CR^{47}R^{48}$, CO, CONH, S or $SO_2$, wherein $R^{47}$ and $R^{48}$ are the same or different and are each independently hydrogen or substituted or unsubstituted C1 to C30 alkyl, for example C1 to C30 fluoroalkyl.

In the above Chemical Formula 2, $X^2$ may be an aromatic organic group, a divalent to hexavalent aliphatic organic group, or a divalent to hexavalent alicyclic organic group. In exemplary embodiments, $X^2$ may be an aromatic organic group or a divalent to hexavalent alicyclic organic group.

For example, $X^2$ may be a residual group derived from aromatic diamine, alicyclic diamine and/or silicon diamine. Herein, the aromatic diamine, alicyclic diamine and silicon diamine may be used singularly or in a mixture of one or more.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenyl sulfide, benzidine, m-phenylenediamine, p-phenylenediamine, 1,5-naphthalenediamine, 2,6-naphthalenediamine, bis[4-(4-aminophenoxy)phenyl]sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds substituted with an alkyl group or a halogen in the aromatic ring, and the like, and combinations thereof.

Examples of the alicyclic diamine may include without limitation 1,2-cyclohexyl diamine, 1,3-cyclohexyl diamine, and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

In the above Chemical Formula 2, $Y^2$ may be an aromatic organic group, a quadrivalent to hexavalent aliphatic organic group, or a quadrivalent to hexavalent alicyclic organic group. For example, $Y^2$ may be an aromatic organic group or a quadrivalent to hexavalent alicyclic organic group.

The $Y^2$ may be a residual group derived from aromatic acid dianhydride, or alicyclic acid dianhydride. Herein, the aromatic acid dianhydride and the alicyclic acid dianhydride may be used singularly or in a mixture of one or more.

Examples of the aromatic acid dianhydride may include without limitation benzophenone tetracarboxylic dianhydrides such as pyromellitic acid dianhydride; benzophenone-3,3',4,4'-tetracarboxylic dianhydride; oxydiphthalic acid dianhydride such as 4,4'-oxydiphthalic dianhydride; biphthalic dianhydrides such as 3,3',4,4'-biphthalic dianhydride; hexafluoroisopropyledene)diphthalic dianhydrides such as 4,4'-(hexafluoroisopropyledene)diphthalic dianhydride; naphthalene-1,4,5,8-tetracarboxylic dianhydride; 3,4,9,10-perylenetetracarboxylic dianhydride, and the like, and combinations thereof.

Examples of the alicyclic acid dianhydride may include without limitation 1,2,3,4-cyclobutanetetracarboxylic dianhydride, 1,2,3,4-cyclopentanetetracarboxylic dianhydride, 5-(2,5-dioxotetrahydrofuryl)-3-methyl-cyclohexane-1,2-dicarboxylic anhydride, 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, and combinations thereof.

The alkali soluble resin may include a thermally polymerizable functional group derived from a reactive end-capping monomer at at least one terminal end of branched chain of the alkali soluble resin. The reactive end-capping monomer may include monoamines including double bonds, monoanhydrides including double bonds, or a combination thereof. Examples of the monoamines may include without limitation toluidine, dimethylaniline, ethylaniline, aminophenol, aminobenzylalcohol, aminoindane, aminoacetonephenone, and the like, and combinations thereof.

The alkali soluble resin may have a weight average molecular weight (Mw) of about 3,000 to about 300,000 g/mol. When the weight average molecular weight is within the above range, sufficient properties may be obtained, and it may be easy to handle due to improved dissolution for an organic solvent.

(B) Photosensitive Diazoquinone Compound

The photosensitive diazoquinone compound may be a compound including a 1,2-benzoquinone diazide and/or 1,2-naphtoquinone diazide structure.

Examples of the photosensitive diazoquinone compound may include one or more of the compounds represented by the following Chemical Formulae 17 and 19 to 21, but are not limited thereto.

[Chemical Formula 17]

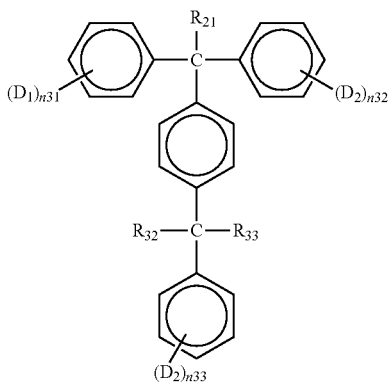

In the above Chemical Formula 17,
$R^{31}$ to $R^{33}$ are the same or different and are each independently hydrogen or substituted or unsubstituted alkyl, for example $CH_3$,
$D_1$ to $D_3$ are the same or different and are each independently OQ, wherein Q is hydrogen or the following Chemical Formula 18a or 18b, provided that all Qs are not simultaneously hydrogen, and
n31 to n33 are the same or different and are each independently an integer ranging from 1 to 3.

[Chemical Formula 18a]

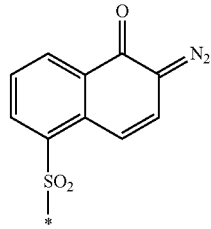

[Chemical Formula 18b]

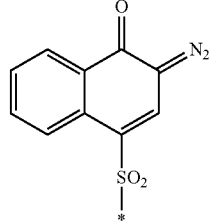

[Chemical Formula 19]

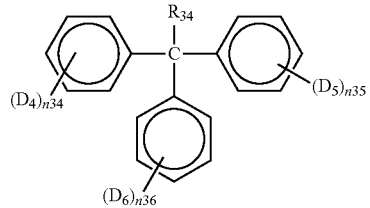

In the above Chemical Formula 19,
$R^{34}$ is hydrogen or substituted or unsubstituted alkyl,
$D_4$ to $D_6$ are the same or different and are each OQ wherein Q is the same as defined in the above Chemical Formula 17, and
n34 to n36 are the same or different and are each independently integers ranging from 1 to 3.

[Chemical Formula 20]

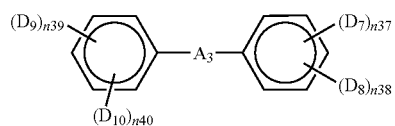

In the above Chemical Formula 20,
$A_3$ is CO or CRR', wherein R and R' are the same or different and are each independently substituted or unsubstituted alkyl,
$D_7$ to $D_{10}$ are the same or different and are each independently, hydrogen, substituted or unsubstituted alkyl, OQ, or NHQ, wherein Q is the same as defined in the above Chemical Formula 17,
n37, n38, n39 and n40 are the same or different and are each independently integers ranging from 1 to 4, n37+n38 and n39+n40 are the same or different and are each independently integers of 5 or less, provided that at least one of $D_7$ to $D_{10}$ is OQ, and one aromatic ring includes one to three OQs and the other aromatic ring includes one to four OQs.

[Chemical Formula 21]

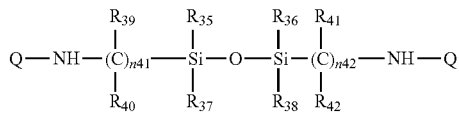

In the above Chemical Formula 21, $R_{35}$ to $R_{42}$ are the same or different and are each independently, hydrogen or substituted or unsubstituted alkyl, n41 and n42 are the same or different and are each independently integers ranging from 1 to 5, for example 2 to 4, and Q is the same as defined in the above Chemical Formula 17.

The positive photosensitive resin composition may include the photosensitive diazoquinone compound in an amount of about 5 to about 100 parts by weight based on about 100 parts by weight of the alkali soluble resin. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the amount of the photosensitive diazoquinone compound is within the above range, the pattern can be well-formed with no or minimal residue from exposure, and film thickness loss during development can be minimized or prevented and thereby a good pattern can be provided.

(E) Phenol Compound

The phenol compound can increases dissolution rate and sensitivity in an exposure region during development with an alkali aqueous solution and can facilitate patterning with a high resolution.

Examples of the phenol compound may include without limitation 2,6-dimethoxymethyl-4-t-butylphenol, 2,6-dimethoxymethyl-p-cresol, 2,6-diacetoxymethyl-p-cresol, and the like, and combinations thereof.

The phenol compound may be, for example represented by one of the following Chemical Formulae 25 to 30, but is not limited thereto.

[Chemical Formula 25]

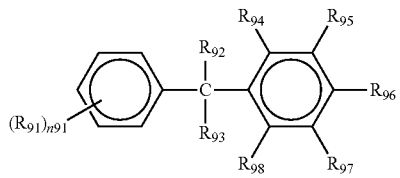

In the above Chemical Formula 25, $R_{91}$ to $R_{93}$ are the same or different and are each independently, hydrogen or substituted or unsubstituted C1 to C10 alkyl, $R_{94}$ to $R_{98}$ are the same or different and are each independently, hydrogen, a hydroxy group, or substituted or unsubstituted C1 to C10 alkyl (e.g., $CH_3$), and n91 is integer ranging from 1 to 5.

[Chemical Formula 26]

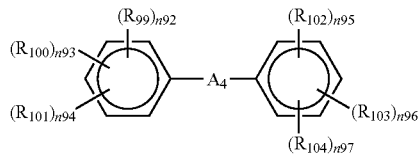

In the above Chemical Formula 26, $R_{99}$ to $R_{104}$ are the same or different and are each independently, hydrogen, a hydroxy group, or substituted or unsubstituted C1 to C10 alkyl, $A_4$ is CR"R'" or a single bond, wherein R" and R'" are the same or different and are each independently, hydrogen, or substituted or unsubstituted C1 to C10 alkyl (e.g., $CH_3$), and n92+n93+n94 and n95+n96+n97 are the same or different and are each independently integers of 5 or less.

[Chemical Formula 27]

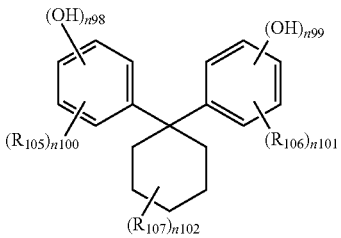

In the above Chemical Formula 27, $R_{105}$ to $R_{107}$ are the same or different and are each independently, hydrogen or substituted or unsubstituted C1 to C10 alkyl, n98, n99 and n102 are the same or different and are each independently integers ranging from 1 to 5, and n100 and n101 are the same or different and are each independently integers ranging from 0 to 4.

[Chemical Formula 28]

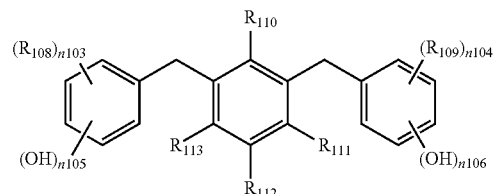

In the above Chemical Formula 28, $R_{108}$ to $R_{113}$ are the same or different and are each independently, hydrogen, a hydroxy group, or substituted or unsubstituted C1 to C10 alkyl, and n103 to n106 are the same or different and are each independently integers ranging from 1 to 4, provided that n103+n105 and n104+n106 are independently integers of 5 or less.

[Chemical Formula 29]

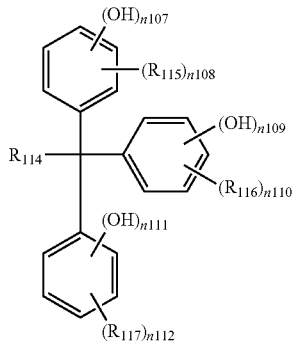

In the above Chemical Formula 29, $R_{114}$ is substituted or unsubstituted C1 to C10 alkyl (e.g., $CH_3$), $R_{115}$ to $R_{117}$ are the same or different and are each independently, hydrogen or substituted or unsubstituted C1 to C10 alkyl, n107, n109 and n111 are the same or different and are each independently integers ranging from 1 to 5, and n108, n110 and n112 are the same or different and are each independently integers ranging from 0 to 4, provided that n107+n108, n109+n110 and n111+n112 are independently integers of 5 or less.

[Chemical Formula 30]

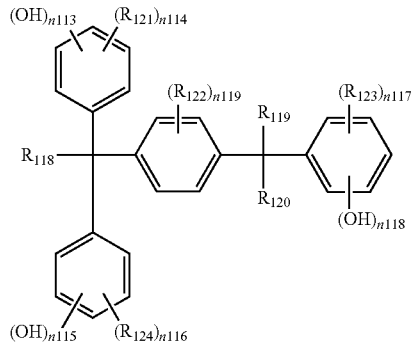

In the above Chemical Formula 30, $R_{118}$ to $R_{120}$ are the same or different and are each independently substituted or unsubstituted C1 to C10 alkyl (e.g., $CH_3$), $R_{121}$ to $R_{124}$ are the same or different and are each independently hydrogen or substituted or unsubstituted C1 to C10 alkyl, n113, n115 and n118 are the same or different and are each independently integers ranging from 1 to 5, n114, n116 and n117 are the same or different and are each independently integers ranging from 0 to 4, n119 is an integer ranging from 1 to 4, provided that n113+n114, n115+n116 and n117+n118 are independently integers of 5 or less.

The positive photosensitive resin composition may include the phenol compound in an amount of about 1 to about 50 parts by weight based on about 100 parts by weight of the alkali soluble resin. In some embodiments, the positive photosensitive resin composition may include the phenol compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the phenol compound can be in a range from about any of the foregoing amounts to about any other of the foregoing amounts.

When the phenol compound is used in an amount within the above range, a satisfactory pattern may be obtained by not deteriorating sensitivity during development but appropriately increasing a dissolution rate, and excellent storage stability may be obtained due to no precipitation when stored in a freezer.

(F) Organic Solvent

The positive photosensitive resin composition includes a solvent being capable of easily dissolving each component.

The solvent may improve film uniformity during coating and prevent generation of a coating stain and a pin spot and thus can form a uniform pattern.

Examples of the solvent may include without limitation alcohols such as methanol, ethanol, benzylalcohol, hexylalcohol, and the like; ethylene glycolalkyletheracetates such as ethylene glycol methyletheracetate, ethylene glycol ethyletheracetate, and the like; ethylene glycol alkyl ether propionates such as ethylene glycolmethylether propionate, ethylene glycolethylether propionate, and the like; ethylene glycolmonoalkylethers such as ethylene glycolmethylether, ethylene glycolethylether, and the like; diethylene glycolalkylethers such as diethylene glycolmonomethylether, diethylene glycol monoethylether, diethylene glycol dimethylether, diethylene glycolmethylethylether, and the like; propylene glycolalkyletheracetates such as propylene glycol methylether acetate, propylene glycolethyletheracetate, propylene glycolpropyletheracetate, and the like; propylene glycolalkylether propionates such as propylene glycolmethylether propionate, propylene glycolethylether propionate, propylene glycolpropylether propionate, and the like; propylene glycolmonoalkylethers such as propylene glycolmethylether, propylene glycolethylether, propylene glycolpropylether, propylene glycolbutylether, and the like; dipropylene glycolalkylethers such as dipropylene glycoldimethylether, dipropylene glycoldiethylether, and the like; butylene glycolmonomethylethers such as butylene glycolmonomethylether, butylene glycolmonoethylether, and the like; dibutylene glycolalkylethers such as dibutylene glycoldimethylether, dibutylene glycoldiethylether, and the like. Such a solvent may be used singularly or in a mixture of two or more.

The positive photosensitive resin composition may include the solvent in an amount of about 3 wt % to about 30 wt %, for example about 5 wt % to about 30 wt %, based on the total solid amount of the positive photosensitive resin composition. In some embodiments, the positive photosensitive resin composition may include the solvent in an amount of about 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the solvent can be in a range from about any of the foregoing amounts to about any other of the foregoing amounts.

When the solvent is included in an amount within the above range, coating processes may become easier and thus coating flatness may be improved.

(G) Other Additives

The positive photosensitive resin composition according to one embodiment may further include one or more other additives.

The other additive may include a suitable surfactant and/or leveling agent to prevent a stain of the film and/or to improve the development. In addition, a silane coupling agent may be used as an adherence promoting agent in order to improve adherence with a substrate.

The surfactant, the leveling agent, and the silane coupling agent may be used singularly or in a mixture thereof.

The surfactant may include a siloxane-based surfactant and/or a fluorine atom-containing surfactant, and the surfactant may be included in an amount of about 0.005 parts by weight to about 0.3 parts by weight based on about 100 parts by weight of the photosensitive resin composition. When the surfactant is used in an amount within the above range, film uniformity can be improved by minimizing generation of a stain.

Examples of the siloxane-based surfactant may include without limitation one of the BYK series made by German BYK Additives & Instruments, and examples of the fluorine atom-containing surfactant may include without limitation one of the Mega Face series made by Dainippon Ink & Chemicals Inc. and the like, but are not limited thereto.

The silane coupling agent may include a carbon-carbon unsaturated bond-containing silane compound such as vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and the like, and combinations thereof.

The other additive may be used singularly or in a mixture of two or more.

The process for forming a pattern using the positive photosensitive resin composition according to one embodiment includes coating the positive photosensitive resin composition on a supporting substrate using spin coating, slit coating, inkjet printing, and the like; drying the coated positive photosensitive resin composition to form a positive photosensitive resin composition layer; exposing the positive photosensitive resin composition layer; developing the positive photosensitive resin composition layer in an alkali aqueous solution to provide a photosensitive resin film; and heating the photosensitive resin film. The conditions of processes to provide a pattern are widely known in this art, so detailed descriptions thereof will be omitted in this specification.

According to another embodiment of the present invention, a photosensitive resin film fabricated using the positive photosensitive resin composition is provided.

The photosensitive resin film may be used as an insulation layer, a buffer layer, and/or a protective layer.

According to further another embodiment, a display device including the photosensitive resin film is provided.

The display device may be an organic light emitting diode (OLED) and/or a liquid crystal display (LCD).

That is to say, the positive photosensitive resin composition according to one embodiment may be applied to an insulation layer, a passivation layer, and/or an insulation interlayer in a display device.

EXAMPLES

Hereinafter, the present invention is illustrated in more detail with reference to the following examples and comparative examples. However, the following examples and comparative examples are provided for the purpose of descriptions and the present invention is not limited thereto.

Synthesis of Alkali Soluble Resin

Synthesis Example 1

Synthesis of Polybenzoxazole Precursor (PA-1)

17.4 g of 2,2-bis(3-amino-4-hydroxyphenyl)-1,1,1,3,3,3-hexafluoropropane and 0.86 g of 1,3-bis(aminopropyl)tetramethyldisiloxane are put in a four-necked flask equipped with an agitator, a temperature controller, a nitrogen gas injector and a cooler while nitrogen is passed through the flask, and 280 g of N-methyl-2-pyrrolidone (NMP) is added thereto to dissolve the mixture. Herein, the obtained solution includes a solid content of 9 wt %.

When the solid is completely dissolved in the solution, 9.9 g of pyridine is added thereto, and a solution obtained by dissolving 13.3 g of 4,4'-oxydibenzonyl chloride in 142 g of N-methyl-2-pyrrolidone (NMP) is slowly added thereto in a dropwise fashion while the mixture is maintained at 0 to 5° C. After the addition in a dropwise fashion, a reaction is performed at 0 to 5° C. for one hour and then, for one hour more after increasing its temperature to room temperature.

Subsequently, 1.6 g of 5-norbornene-2,3-dicarboxyl anhydride is added thereto, and the mixture is agitated at room temperature for 2 hours, completing the reaction. The reaction mixture is put in a solution of water/methanol (a volume ratio of 10/1) to produce a precipitate, and the precipitate is filtered, sufficiently washed with water, and dried at 80° C. under vacuum for greater than or equal to 24 hours, preparing a polybenzoxazole precursor (PA-1).

Synthesis Example 2

Synthesis of Polybenzoxazole Precursor (PA-2)

A polybenzoxazole precursor (PA-2) is prepared according to the same method as Synthesis Example 1 except for using maleic anhydride instead of the 5-norbornene-2,3-dicarboxyl anhydride.

Synthesis Example 3

Synthesis of Polybenzoxazole Precursor (PA-3)

A polybenzoxazole precursor (PA-3) is prepared according to the same method as Synthesis Example 1 except for using aconitic anhydride instead of the 5-norbornene-2,3-dicarboxyl anhydride.

Synthesis Example 4

Synthesis of Polyimide Precursor (PI-1)

31.02 g of bis-(3,4-dicarboxylic acid anhydride)ether is put in a four-necked flask having an agitator, a temperature controller, a nitrogen gas injector and a cooler while nitrogen is passed therethrough, and 1500 ml of acetic acid was added thereto. This mixture w is as agitated at room temperature for one hour and then, for 12 hours more after increasing the temperature until the solvent is refluxed. The solution is cooled down to room temperature again, and a white solid extracted therein is filtered and three times washed with cold ethanol. The obtained solid is heated at 100° C. under vacuum and dried for 12 hours.

The solid is put in a four-necked flask having an agitator, a temperature controller, a nitrogen gas injector and a cooler, and 500 g of chloride thionyl is added thereto while nitrogen is passed through the flask. The solution is agitated for 12 hours more after increasing its temperature until chloride thionyl is refluxed. The solution is cooled down to room temperature again, and the chloride thionyl is all removed under vacuum. The obtained white solid is five times washed with toluene and then, dried for 12 hours while heated at 50° C.

18.3 g of 2,2-bis(3-amino-4-hydroxyphenyl)-1,1,1,3,3,3-hexafluoropropane is put in a four-necked flask having an agitator, a temperature controller, a nitrogen gas injector and a cooler while nitrogen is passed through the flask, and 240 g of N-methyl-2-pyrrolidone (NMP) is was added thereto to dissolve it. Herein, the obtained solution includes a solid content of 9 wt %.

When the solid is completely dissolved, 5.6 g of pyridine is added thereto, and a solution obtained by dissolving 20.5 g of the solid obtained in the above experiment in 142 g of N-methyl-2-pyrrolidone (NMP) is slowly added thereto in a dropwise fashion form 30 minutes while the temperature is maintained at 0 to 5° C. After the addition in a dropwise fashion, the mixture is reacted for 1 hour at 0 to 5° C. and then, agitated for one hour after increasing its temperature to room temperature, completing the reaction. The reaction mixture is added to a solution of water/methanol (a volume ratio of 10/1) to produce a precipitate, and the precipitate is filtered and sufficiently washed with water and then, dried at 80° C. under vacuum for greater than or equal to 24 hours, preparing a polyimide precursor (PI-1).

Synthesis Example 5

Synthesis of Polyimide Precursor (PI-2)

A polyimide precursor (PI-2) is prepared according to the same method as Synthesis Example 4 except for using 35.83 g of bis-(3,4-dicarboxylic acid anhydride)sulfone instead of 31.02 g of bis-(3,4-dicarboxylic acid anhydride)ether and reacting 22.17 g of a solid obtained therefrom with 18.3 g of 2,2-bis(3-amino-4-hydroxyphenyl)-1,1,1,3,3,3-hexafluoropropane.

Preparation of Positive Photosensitive Resin Composition

Example 1

A positive photosensitive resin composition is obtained by dissolving 15 g of the polybenzoxazole precursor (PA-1) according to Synthesis Example 1, 5.55 g of photosensitive diazoquinone represented by the following Chemical Formula A, 0.75 g of a thermal acid generator represented by Chemical Formula 38, 0.75 g of a cross-linking agent represented by Chemical Formula 63, 2.25 g of a phenol compound represented by the following Chemical Formula B in 40.289 g of propylene glycol monomethylether (a boiling point of 118° C.), 16.482 g of ethyl lactate (a boiling point of 158° C.), 1.766 g of γ-butyl lactone (a boiling point of 205° C.), and adding 0.00365 g of a fluorine-based leveling agent F-554 thereto, agitating the mixture, and filtering the resultant with a 0.45 μm-fluoro resin filter.

The positive photosensitive resin composition is coated in a method of slit coating and the like on an ITO-patterned glass substrate, removing a solvent therein in a drying process under a reduced pressure, and subsequently, drying the coated substrate on a hot plate to obtain a 4 μm-thick coating layer. Subsequently, the pattern is exposed by using a broad band exposer at room temperature of 23° C. and appropriate light energy capable of forming a pattern with a mask, developed by using an alkali development aqueous solution (TMAH of 2.38%) for 90 seconds at room temperature (23° C.) and washed with water, and then, cured at 250° C. in a high temperature-curing oven under a nitrogen stream.

In the exposure/development process, film residue ratio and sensitivity of the pattern are evaluated, and a scum on the pattern is examined with an optical microscope. After the curing, shrinkage ratio and taper angle are evaluated through V-SEM, and decomposition temperature through TGA, and out gas and the like through TD-GC/MS.

[Chemical Formula A]

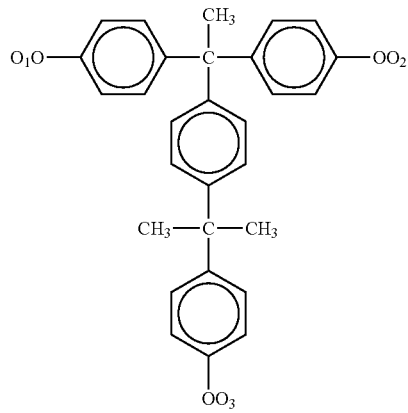

In the above chemical formula, Q, $Q_1$ to $Q_3$ are independently hydrogen,

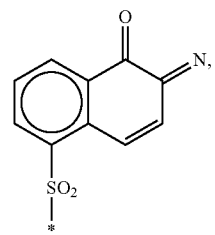

provided all are not hydrogen.

[Chemical Formula 38]

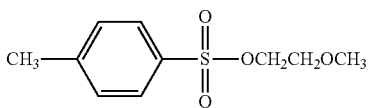

-continued

[Chemical Formula 63]

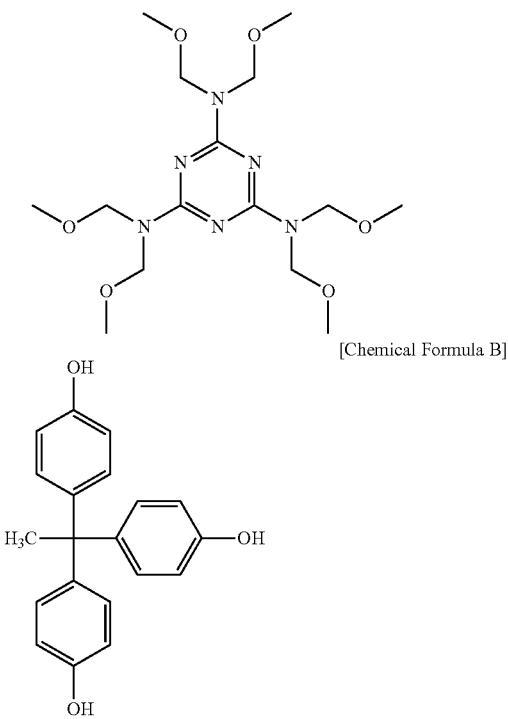

[Chemical Formula B]

Example 2

A positive photosensitive resin composition is obtained according to the same method as Example 1 except for changing the amount of the thermal acid generator represented by Chemical Formula 38 from 0.75 g to 3 g.

Example 3

A positive photosensitive resin composition is obtained according to the same method as Example 1 except for changing the amount of the cross-linking agent represented by Chemical Formula 63 from 0.75 g to 3 g.

Example 4

A positive photosensitive resin composition is obtained according to the same method as Example 1 except for using the polybenzoxazole precursor (PA-2) instead of 15 g of the polybenzoxazole precursor (PA-1).

Example 5

A positive photosensitive resin composition is obtained according to the same method as Example 4 except for changing the amount of the thermal acid generator represented by Chemical Formula 38 from 0.75 g to 3 g.

Example 6

A positive photosensitive resin composition is obtained according to the same method as Example 4 except for changing the amount of the cross-linking agent represented by Chemical Formula 63 from 0.75 g to 3 g.

Example 7

A positive photosensitive resin composition is obtained according to the same method as Example 1 except for using the polybenzoxazole precursor PA-3 instead of 15 g of the polybenzoxazole precursor (PA-1).

Example 8

The positive photosensitive resin composition is obtained according to the same method as Example 7 except for changing the amount of the thermal acid generator represented by Chemical Formula 38 from 0.75 g to 3 g.

Example 9

The positive photosensitive resin composition is obtained according to the same method as Example 7 except for changing the amount of the cross-linking agent represented by Chemical Formula 63 from 0.75 g to 3 g.

Example 10

The positive photosensitive resin composition is obtained according to the same method as Example 1 except for using the polyimide precursor (PI-1) instead of 15 g of the polybenzoxazole precursor (PA-1).

Example 11

A positive photosensitive resin composition is obtained according to the same method as Example 10 except for changing the amount of the thermal acid generator represented by Chemical Formula 38 from 0.75 g to 3 g.

Example 12

A positive photosensitive resin composition is obtained according to the same method as Example 10 except for changing the amount of the cross-linking agent represented by Chemical Formula 63 from 0.75 g to 3 g.

Example 13

A positive photosensitive resin composition is obtained according to the same method as Example 1 except for using polyimide precursor (PI-2) instead of 15 g of the polybenzoxazole precursor (PA-1).

Example 14

A positive photosensitive resin composition is obtained according to the same method as Example 13 except for changing the amount of the thermal acid generator represented by Chemical Formula 38 from 0.75 g to 3 g.

Example 15

A positive photosensitive resin composition is obtained according to the same method as Example 13 except for changing the amount of the cross-linking agent represented by Chemical Formula 63 from 0.75 g to 3 g.

Example 16

A positive photosensitive resin composition is obtained according to the same method as Example 1 except for using 7.5 g of the thermal acid generator represented by Chemical Formula 38 and 7.5 g of the melamine-based cross-linking agent represented by Chemical Formula 63.

Example 17

A positive photosensitive resin composition is obtained according to the same method as Example 1 except for using 0.75 g of a thermal acid generator represented by Chemical Formula 43.

[Chemical Formula 43]

![Chemical Formula 43 structure]

Example 18

A positive photosensitive resin composition is obtained according to the same method as Example 1 except for using 7.5 g of the thermal acid generator represented by Chemical Formula 43 and 7.5 g of the melamine-based cross-linking agent represented by Chemical Formula 63.

Example 19

A positive photosensitive resin composition is obtained according to the same method as Example 1 except for using 0.75 g of a thermal acid generator represented by Chemical Formula 45.

[Chemical Formula 45]

![Chemical Formula 45 structure]

Example 20

A positive photosensitive resin composition is obtained according to the same method as Example 1 except for using 7.5 g of the thermal acid generator represented by Chemical Formula 45 and 7.5 g of the melamine-based cross-linking agent represented by Chemical Formula 63.

Example 21

A photosensitive resin composition is obtained according to the same method as Example 1 except for using 0.75 g of a cross-linking agent represented by Chemical Formula 89.

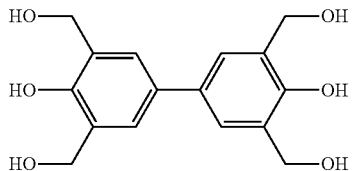

[Chemical Formula 89]

Example 22

A positive photosensitive resin composition is obtained according to the same method as Example 11 except for using 7.5 g of the thermal acid generator represented by Chemical Formula 38 and 7.5 g of a cross-linking agent represented by Chemical Formula 89.

Example 23

A positive photosensitive resin composition is obtained according to the same method as Example 11 except for using 0.75 g of the thermal acid generator represented by Chemical Formula 43 and 0.75 g of the cross-linking agent represented by Chemical Formula 89.

Example 24

A positive photosensitive resin composition is obtained according to the same method as Example 11 except for using 7.5 g of the thermal acid generator represented by Chemical Formula 43 and 7.5 g of the cross-linking agent represented by Chemical Formula 89.

Example 25

A positive photosensitive resin composition is obtained according to the same method as Example 11 except for using 0.75 g of a thermal acid generator represented by Chemical Formula 45 and 0.75 g of the cross-linking agent represented by Chemical Formula 89.

Example 26

A positive photosensitive resin composition is obtained according to the same method as Example 11 except for using 7.5 g of the thermal acid generator represented by Chemical Formula 45 and 7.5 g of the cross-linking agent represented by Chemical Formula 89.

Example 27

A positive photosensitive resin composition is obtained according to the same method as Example 4 except for using 0.75 g of the thermal acid generator represented by Chemical Formula 43.

Example 28

A positive photosensitive resin composition is obtained according to the same method as Example 4 except for using 7.5 g of the thermal acid generator represented by Chemical Formula 43.

Example 29

A positive photosensitive resin composition is obtained according to the same method as Example 4 except for using 0.75 g of a thermal acid generator represented by Chemical Formula 45.

Example 30

A positive photosensitive resin composition is obtained according to the same method as Example 4 except for using 7.5 g of the thermal acid generator represented by Chemical Formula 45.

Example 31

A positive photosensitive resin composition is obtained according to the same method as Example 4 except for using 0.75 g of the thermal acid generator represented by Chemical Formula 38 and 0.75 g of the cross-linking agent represented by Chemical Formula 89.

Example 32

A positive photosensitive resin composition is obtained according to the same method as Example 4 except for using 7.5 g of the thermal acid generator represented by Chemical Formula 38 and 7.5 g of the cross-linking agent represented by Chemical Formula 89.

Example 33

A positive photosensitive resin composition is obtained according to the same method as Example 4 except for using 0.75 g of the thermal acid generator represented by Chemical Formula 43 and 0.75 g of the cross-linking agent represented by Chemical Formula 89.

Example 34

A positive photosensitive resin composition is obtained according to the same method as Example 4 except for using 7.5 g of the thermal acid generator represented by Chemical Formula 43 and 7.5 g of the cross-linking agent represented by Chemical Formula 89.

Example 35

A positive photosensitive resin composition is obtained according to the same method as Example 4 except for using 0.75 g of the thermal acid generator represented by Chemical Formula 45 and 0.75 g of the cross-linking agent represented by Chemical Formula 89.

Example 36

A positive photosensitive resin composition is obtained according to the same method as Example 4 except for using 7.5 g of the thermal acid generator represented by Chemical Formula 45 and 7.5 g of the cross-linking agent represented by Chemical Formula 89.

Example 37

A positive photosensitive resin composition is obtained according to the same method as Example 1 except for using 0.75 g of a cross-linking agent represented by Chemical Formula 65.

[Chemical Formula 65]

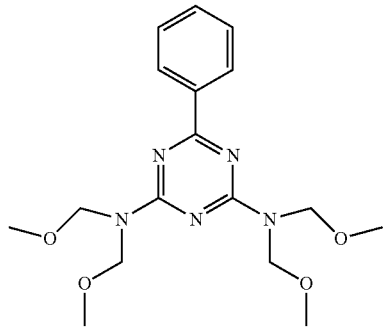

Example 38

A positive photosensitive resin composition is obtained according to the same method as Example 1 except for using 7.5 g of the cross-linking agent represented by Chemical Formula 65.

Example 39

A positive photosensitive resin composition is obtained according to the same method as Example 1 except for using 0.75 g of the thermal acid generator represented by Chemical Formula 43 and 0.75 g of the cross-linking agent represented by Chemical Formula 65.

Example 40

A positive photosensitive resin composition is obtained according to the same method as Example 1 except for using 7.5 g of the thermal acid generator represented by Chemical Formula 43 and 7.5 g of the cross-linking agent represented by Chemical Formula 65.

Example 41

A positive photosensitive resin composition is obtained according to the same method as Example 1 except for using 0.75 g of a thermal acid generator represented by Chemical Formula 45 and 0.75 g of the cross-linking agent represented by Chemical Formula 65.

Example 42

A positive photosensitive resin composition is obtained according to the same method as Example 1 except for using 7.5 g of the thermal acid generator represented by Chemical Formula 45 and 7.5 g of the cross-linking agent represented by Chemical Formula 65.

Comparative Example 1

A positive photosensitive resin composition is obtained by dissolving 15 g of the polybenzoxazole precursor (PA-1) according to Synthesis Example 1, 5.31 g of the photosensitive diazoquinone represented by the above Chemical Formula A, 0.75 g of the cross-linking agent represented by Chemical Formula 63, and 3.75 g of a phenol compound represented by the above Chemical Formula B in 33.355 g of propylene glycol monomethylether (a boiling point of 118° C.), 15.395 g of ethyl lactate (a boiling point of 158° C.), 2.566 g of γ-butyl lactone (a boiling point of 205° C.), and adding 0.0173 g of a fluorine-based leveling agent F-554 thereto, agitating the mixture, and filtering the resultant with a 0.45 μm fluoro resin filter.

Comparative Example 2

A positive photosensitive resin composition is obtained according to the same method as Comparative Example 1 except for using 7.5 g of the cross-linking agent represented by Chemical Formula 63.

Comparative Example 3

A positive photosensitive resin composition is obtained according to the same method as Comparative Example 1 except for using 0.75 g of the cross-linking agent represented by Chemical Formula 89.

Comparative Example 4

A positive photosensitive resin composition is obtained according to the same method as Comparative Example 1 except for using 7.5 g of the cross-linking agent represented by Chemical Formula 89.

Comparative Example 5

A positive photosensitive resin composition is obtained according to the same method as Comparative Example 1 except for using 0.75 g of the cross-linking agent represented by Chemical Formula 65.

Comparative Example 6

A positive photosensitive resin composition is obtained according to the same method as Comparative Example 1 except for using 7.5 g of the cross-linking agent represented by Chemical Formula 65.

Comparative Example 7

A positive photosensitive resin composition is obtained according to the same method as Comparative Example 1 except for using the polyimide precursor (PI-1) instead of the polybenzoxazole precursor (PA-1).

Comparative Example 8

A positive photosensitive resin composition is obtained according to the same method as Comparative Example 2 except for using the polyimide precursor (PI-1) instead of the polybenzoxazole precursor (PA-1).

Comparative Example 9

A positive photosensitive resin composition is obtained according to the same method as Comparative Example 3 except for using the polyimide precursor (PI-1) instead of the polybenzoxazole precursor (PA-1).

Comparative Example 10

A positive photosensitive resin composition is obtained according to the same method as Comparative Example 4 except for using the polyimide precursor (PI-1) instead of the polybenzoxazole precursor (PA-1).

Comparative Example 11

A positive photosensitive resin composition is obtained according to the same method as Comparative Example 5 except for using the polyimide precursor (PI-1) instead of the polybenzoxazole precursor (PA-1).

Comparative Example 12

A positive photosensitive resin composition is obtained according to the same method as Comparative Example 6 except for using the polyimide precursor (PI-1) instead of the polybenzoxazole precursor (PA-1).

Comparative Example 13

A positive photosensitive resin composition is obtained by dissolving 15 g of the polybenzoxazole precursor (PA-1) according to Synthesis Example 1, 5.31 g of photosensitive diazoquinone represented by the above Chemical Formula A, and 3.75 g of a phenol compound represented by the above Chemical Formula B in 33.355 g of propylene glycol monomethylether (a boiling point of 118° C.), 15.395 g of ethyl lactate (a boiling point 158° C.), 2.566 g of γ-butyl lactone (a boiling point of 205° C.), and adding 0.0173 g of a fluorine-based leveling agent F-554 thereto, agitating the mixture, and filtering the resultant with a 0.45 μm fluoro resin filter.

Comparative Example 14

A positive photosensitive resin composition is obtained according to the same method as Comparative Example 13 except for using the polybenzoxazole precursor (PA-2) instead of the polybenzoxazole precursor (PA-1).

Comparative Example 15

A positive photosensitive resin composition is obtained according to the same method as Comparative Example 13 except for using the polybenzoxazole precursor (PA-3) instead of the polybenzoxazole precursor (PA-1).

Comparative Example 16

A positive photosensitive resin composition is obtained according to the same method as Comparative Example 13 except for using the polyimide precursor (PI-1) instead of the polybenzoxazole precursor (PA-1).

Comparative Example 17

A positive photosensitive resin composition is obtained according to the same method as Comparative Example 13 except for using the polyimide precursor (PI-2) instead of the polybenzoxazole precursor (PA-1).

Compositions of the photosensitive resin compositions according to the Examples and Comparative Examples by respectively using the alkali soluble resins according to Synthesis Examples 1 to 5 are provided in the following Table 1.

TABLE 1
| | Alkali soluble resin | Thermal acid generator | | Cross-linking agent | |
|---|---|---|---|---|---|
| | | Chemical Formula | wt % | Chemical Formula | wt % |
| Example 1 | PA-1 | 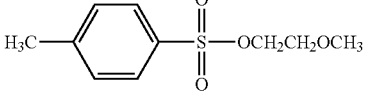 | 5 | 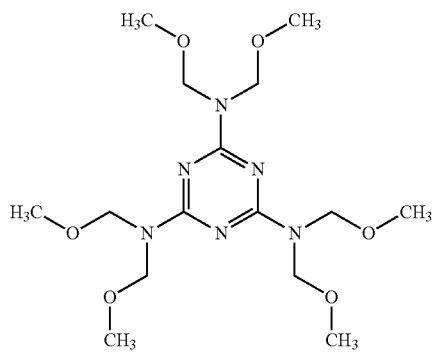 | 5 |
| Example 2 | PA-1 | 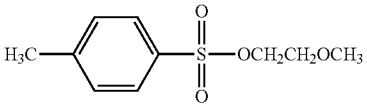 | 20 | 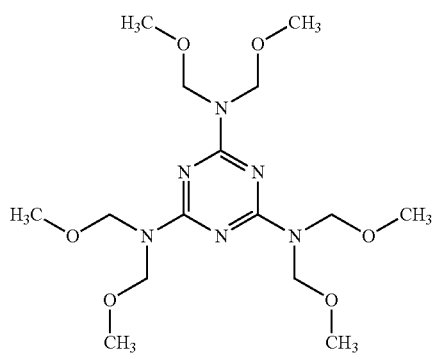 | 5 |
| Example 3 | PA-1 | 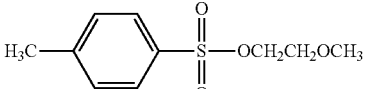 | 5 | 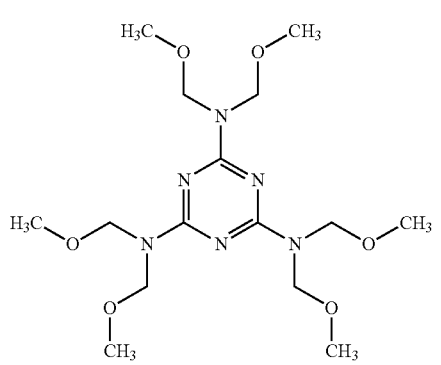 | 20 |
| Example 4 | PA-2 | 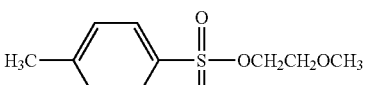 | 5 | 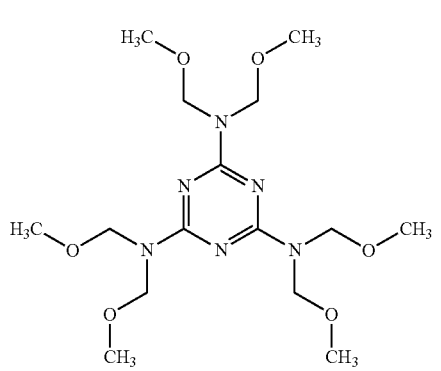 | 5 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Example 5 | PA-2 | 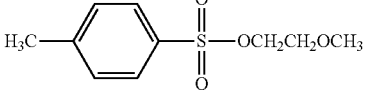 | 20 | 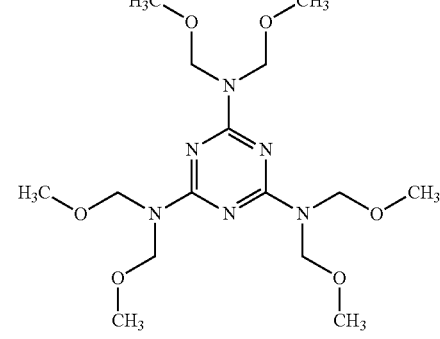 | 5 |
| Example 6 | PA-2 | 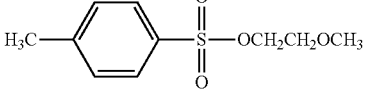 | 5 | 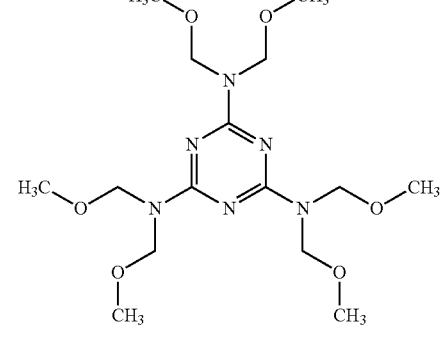 | 20 |
| Example 7 | PA-3 | 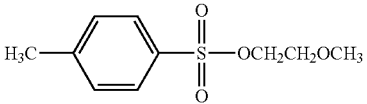 | 5 | 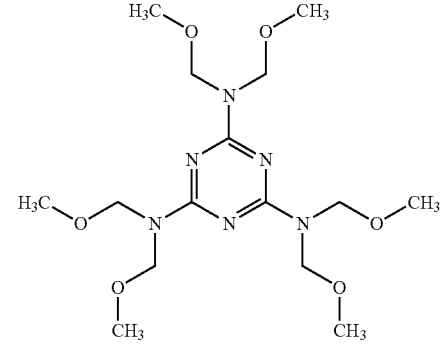 | 5 |
| Example 8 | PA-3 | 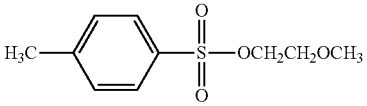 | 20 | 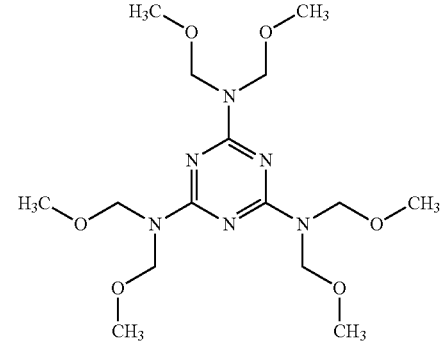 | 5 |

TABLE 1-continued

| | Alkali soluble resin | Thermal acid generator | | Cross-linking agent | |
|---|---|---|---|---|---|
| | | Chemical Formula | wt % | Chemical Formula | wt % |
| Example 9 | PA-3 | H₃C—C₆H₄—S(O)₂—OCH₂CH₂OCH₃ | 5 | hexakis(methoxymethyl)melamine | 20 |
| Example 10 | PI-1 | H₃C—C₆H₄—S(O)₂—OCH₂CH₂OCH₃ | 5 | hexakis(methoxymethyl)melamine | 5 |
| Example 11 | PI-1 | H₃C—C₆H₄—S(O)₂—OCH₂CH₂OCH₃ | 20 | hexakis(methoxymethyl)melamine | 5 |
| Example 12 | PI-1 | H₃C—C₆H₄—S(O)₂—OCH₂CH₂OCH₃ | 5 | hexakis(methoxymethyl)melamine | 20 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Example 13 | PI-2 | 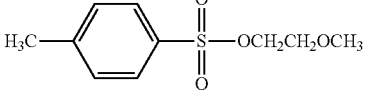 | 5 | 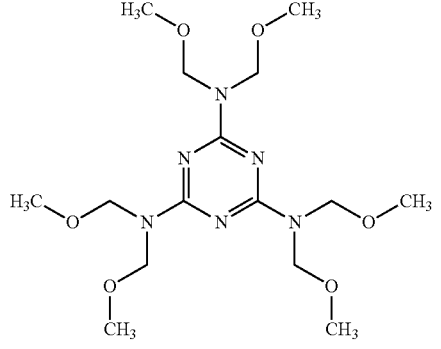 | 5 |
| Example 14 | PI-2 | 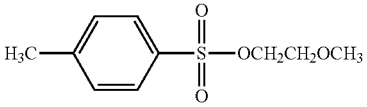 | 20 | 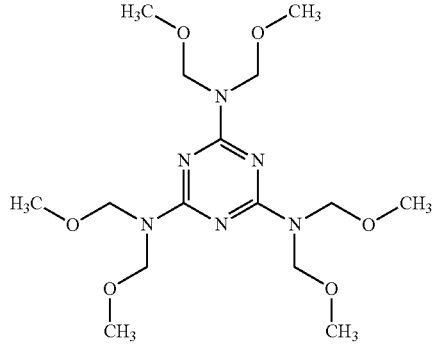 | 5 |
| Example 15 | PI-2 | 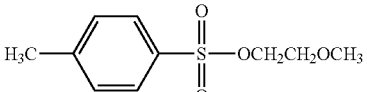 | 5 | 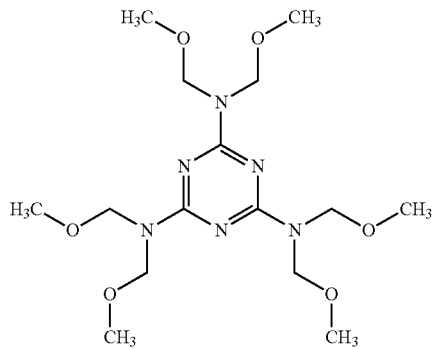 | 20 |
| Example 16 | PA-1 | 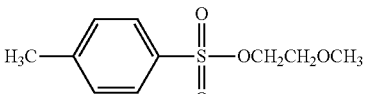 | 50 | 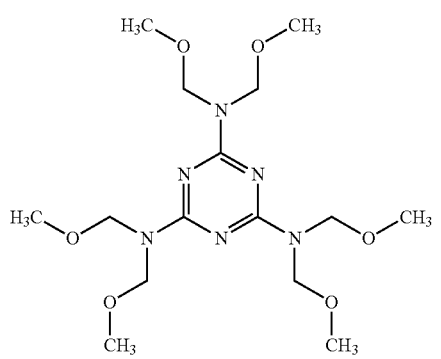 | 50 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Example 17 | PA-1 | 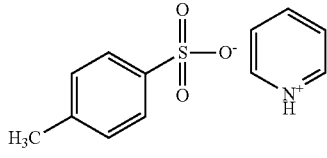 | 5 | 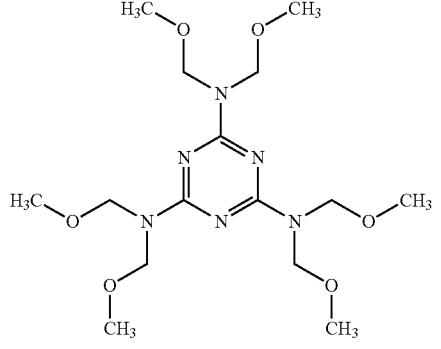 | 5 |
| Example 18 | PA-1 | 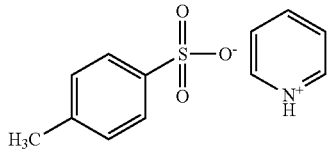 | 50 | 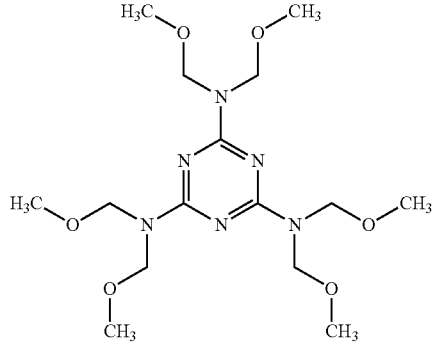 | 50 |
| Example 19 | PA-1 | 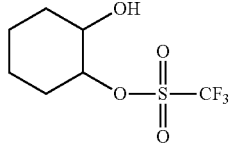 [SMILES: O=S(=O)(OC1CCCCC1O)C(F)(F)F] | 5 | 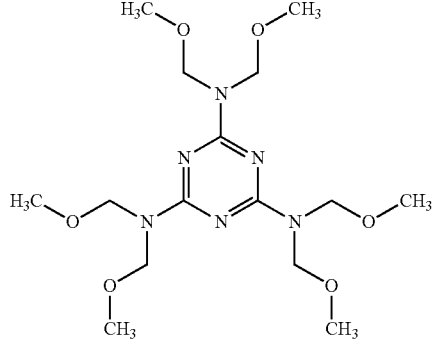 | 5 |
| Example 20 | PA-1 | 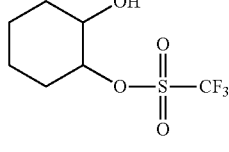 | 50 | 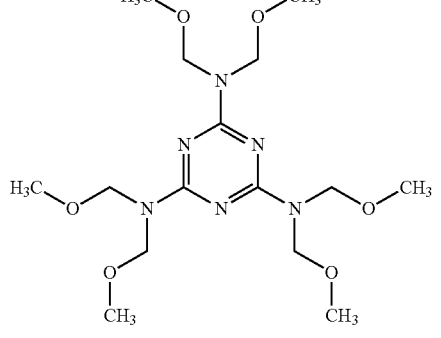 | 50 |

TABLE 1-continued

| | Alkali soluble resin | Thermal acid generator | | Cross-linking agent | |
|---|---|---|---|---|---|
| | | Chemical Formula | wt % | Chemical Formula | wt % |
| Example 21 | PA-1 | H₃C-C₆H₄-SO₂-OCH₂CH₂OCH₃ | 5 | tetrakis(hydroxymethyl)biphenyl-diol | 5 |
| Example 22 | PA-1 | H₃C-C₆H₄-SO₂-OCH₂CH₂OCH₃ | 50 | tetrakis(hydroxymethyl)biphenyl-diol | 50 |
| Example 23 | PA-1 | tosylate pyridinium | 5 | tetrakis(hydroxymethyl)biphenyl-diol | 5 |
| Example 24 | PA-1 | tosylate pyridinium | 50 | tetrakis(hydroxymethyl)biphenyl-diol | 50 |
| Example 25 | PA-1 | 2-hydroxycyclohexyl triflate | 5 | tetrakis(hydroxymethyl)biphenyl-diol | 5 |
| Example 26 | PA-1 | 2-hydroxycyclohexyl triflate | 50 | tetrakis(hydroxymethyl)biphenyl-diol | 50 |
| Example 27 | PI-1 | tosylate pyridinium | 5 | hexa(methoxymethyl)melamine | 5 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Example 28 | PI-1 | 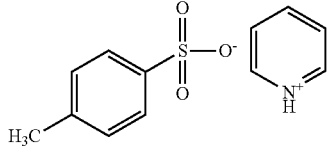 | 50 | 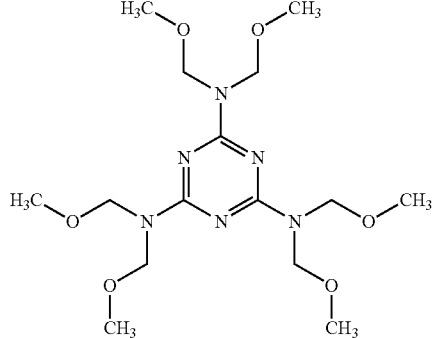 | 50 |
| Example 29 | PI-1 | 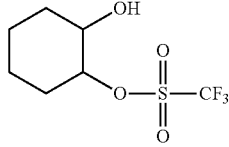 [SMILES: O=S(=O)(OC1CCCCC1O)C(F)(F)F] | 5 | 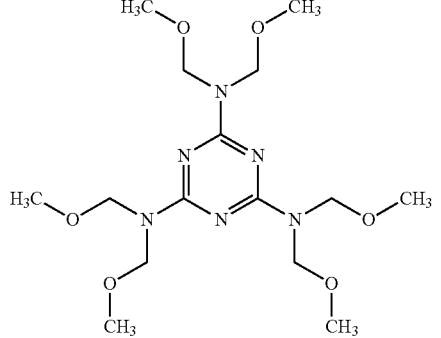 | 5 |
| Example 30 | PI-1 | 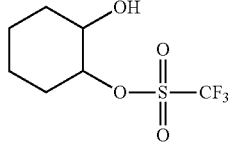 [SMILES: O=S(=O)(OC1CCCCC1O)C(F)(F)F] | 50 | 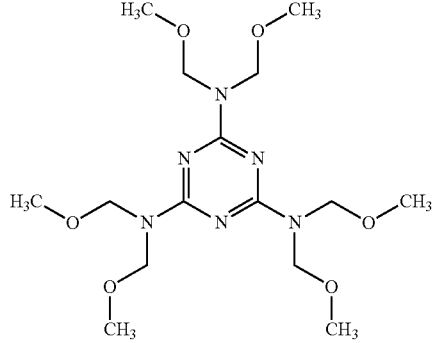 | 50 |
| Example 31 | PI-1 | 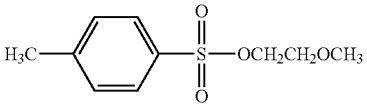 | 5 | 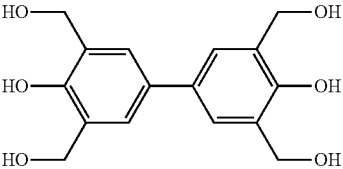 [SMILES: OCc1cc(-c2cc(CO)c(O)c(CO)c2)cc(CO)c1O] | 5 |
| Example 32 | PI-1 | 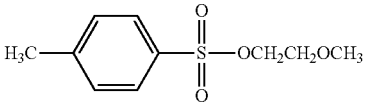 | 50 | 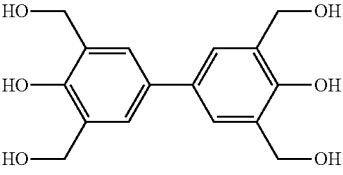 [SMILES: OCc1cc(-c2cc(CO)c(O)c(CO)c2)cc(CO)c1O] | 50 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Example 33 | PI-1 | 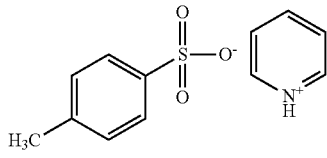 | 5 | 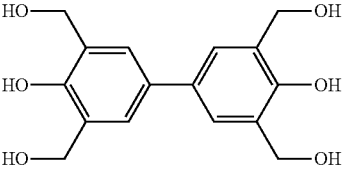 [SMILES: OCc1cc(-c2cc(CO)c(O)c(CO)c2)cc(CO)c1O] | 5 |
| Example 34 | PI-1 | 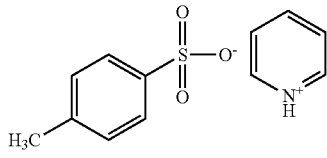 | 50 | 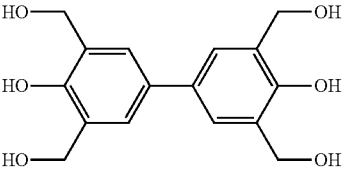 [SMILES: OCc1cc(-c2cc(CO)c(O)c(CO)c2)cc(CO)c1O] | 50 |
| Example 35 | PI-1 | 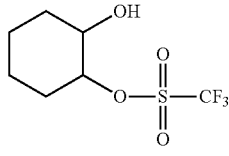 [SMILES: O=S(=O)(OC1CCCCC1O)C(F)(F)F] | 5 | 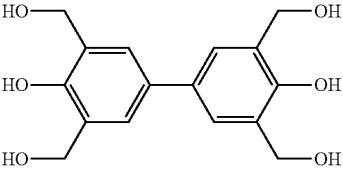 [SMILES: OCc1cc(-c2cc(CO)c(O)c(CO)c2)cc(CO)c1O] | 5 |
| Example 36 | PI-1 | 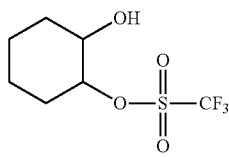 [SMILES: O=S(=O)(OC1CCCCC1O)C(F)(F)F] | 50 | 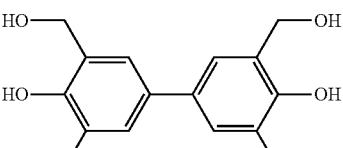 | 50 |
| Example 37 | PA-1 | 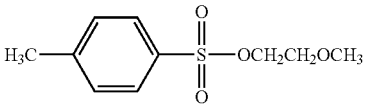 | 5 | 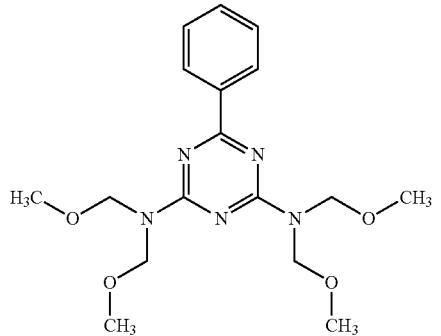 | 5 |
| Example 38 | PA-1 | 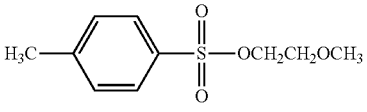 | 50 | 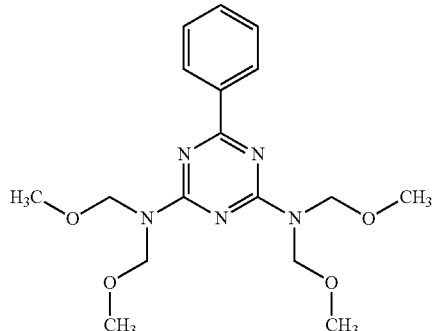 | 50 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Example 39 | PA-1 | 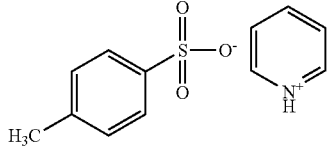 | 5 | 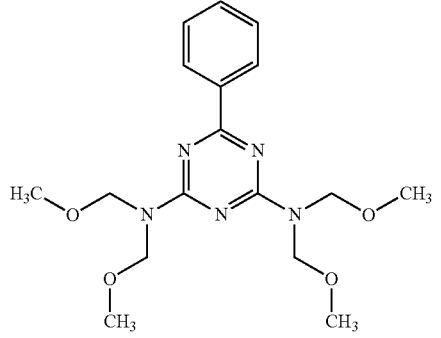 | 5 |
| Example 40 | PA-1 | 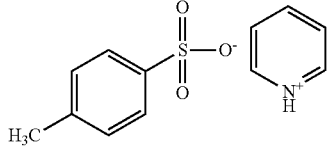 | 50 | 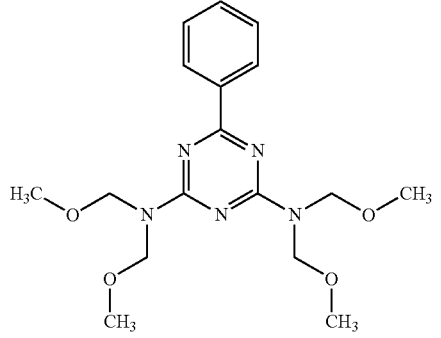 | 50 |
| Example 41 | PA-1 | 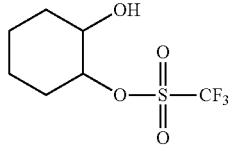 [SMILES: O=S(=O)(OC1CCCCC1O)C(F)(F)F] | 5 | 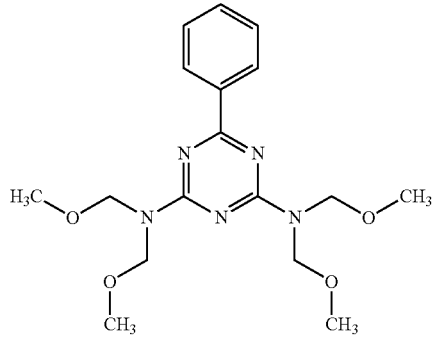 | 5 |
| Example 42 | PA-1 | 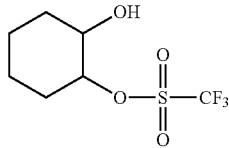 | 50 | 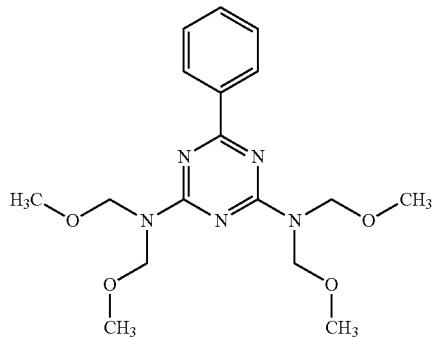 | 50 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Comparative Example 1 | PA-1 | — | — | 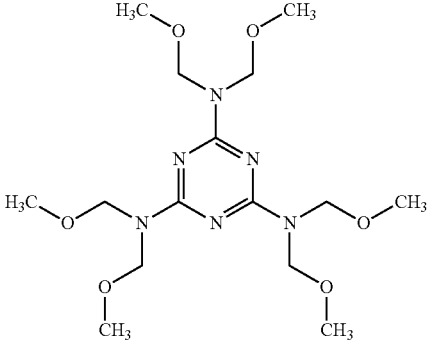 | 5 |
| Comparative Example 2 | PA-1 | — | — | 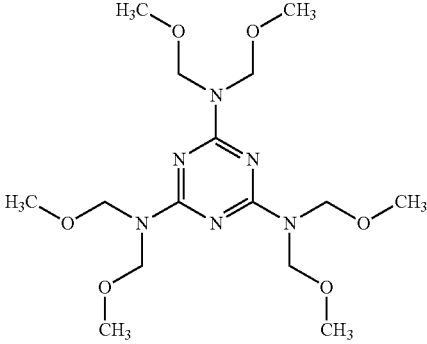 | 50 |
| Comparative Example 3 | PA-1 | — | — | 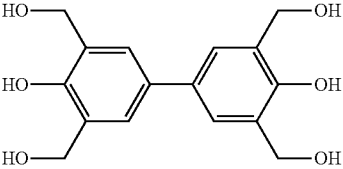 [SMILES: OCc1cc(-c2cc(CO)c(O)c(CO)c2)cc(CO)c1O] | 5 |
| Comparative Example 4 | PA-1 | — | — | 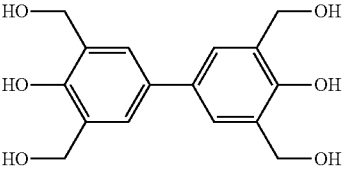 [SMILES: OCc1cc(-c2cc(CO)c(O)c(CO)c2)cc(CO)c1O] | 50 |
| Comparative Example 5 | PA-1 | — | — | 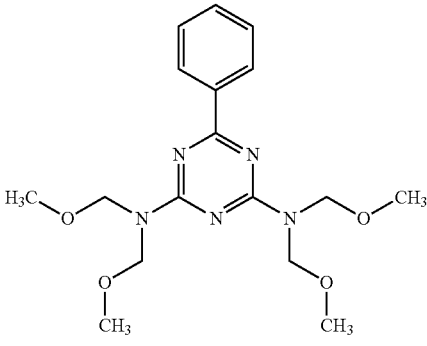 | 5 |

TABLE 1-continued
| | Alkali soluble resin | Thermal acid generator | | Cross-linking agent | |
|---|---|---|---|---|---|
| | | Chemical Formula | wt % | Chemical Formula | wt % |
| Comparative Example 6 | PA-1 | — | — | 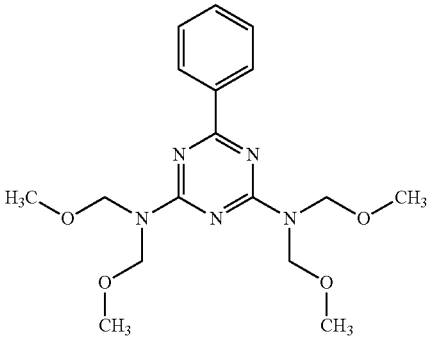 | 50 |
| Comparative Example 7 | PI-1 | — | — | 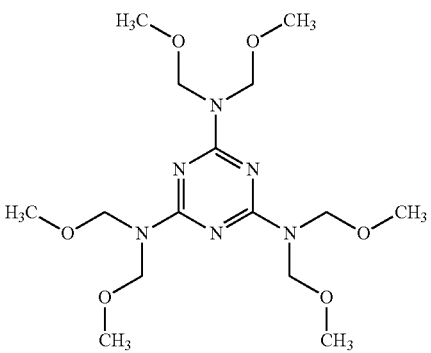 | 5 |
| Comparative Example 8 | PI-1 | — | — | 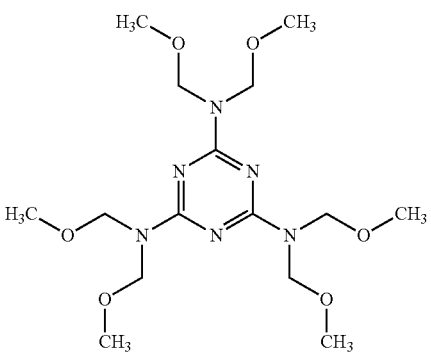 | 50 |
| Comparative Example 9 | PI-1 | — | — | 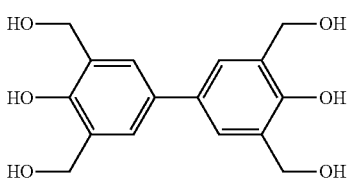 [SMILES: OCc1cc(-c2cc(CO)c(O)c(CO)c2)cc(CO)c1O] | 5 |
| Comparative Example 10 | PI-1 | — | — | 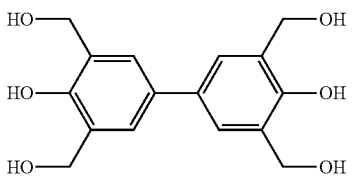 [SMILES: OCc1cc(-c2cc(CO)c(O)c(CO)c2)cc(CO)c1O] | 50 |

TABLE 1-continued

| | Alkali soluble resin | Thermal acid generator | | Cross-linking agent | |
|---|---|---|---|---|---|
| | | Chemical Formula | wt % | Chemical Formula | wt % |
| Comparative Example 11 | PI-1 | — | — | 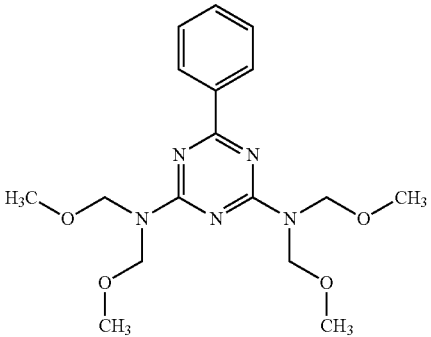 | 5 |
| Comparative Example 12 | PI-1 | — | — | 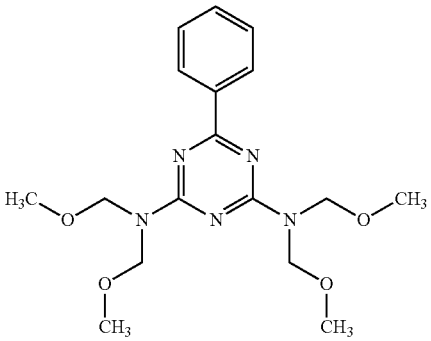 | 50 |
| Comparative Example 13 | PA-1 | — | — | — | — |
| Comparative Example 14 | PA-2 | — | — | — | — |
| Comparative Example 15 | PA-3 | — | — | — | — |
| Comparative Example 16 | PI-1 | — | — | — | — |
| Comparative Example 17 | PI-2 | — | — | — | — |

(Evaluation)

Each positive photosensitive resin composition according to Examples 1 to 42 and Comparative Examples 1 to 17 is coated on an ITO-patterned glass substrate in a method such as slit coating and the like and dried on a hot plate, obtaining a 4 μm-thick coating layer after removing a solvent under a reduced pressure. Subsequently, the coating layer is exposed by using an appropriate light energy capable of forming a pattern at room temperature of 23° C. with a mask and a broadband exposer, developed at room temperature of 23° C. with an alkali development aqueous solution (TMAH of 2.38%) for 90 seconds, washed with water, and cured at 250° C. under a nitrogen stream in a high temperature-curing oven.

Film residue ratio and sensitivity during the exposure/development process are evaluated, and a scum of the patterns is examined through an optical microscope. In addition, a film shrinkage ratio and a taper angle after the curing are evaluated through V-SEM, a decomposition temperature through a thermogravimetric analyzer (TGA), and out gas and the like through TD-GC/MS, and the results are provided in the following Table 2.

TABLE 2

| | Exposure/ development | Curing at 250° C. | | |
|---|---|---|---|---|
| | Film residue ratio (%) | Film shrinkage ratio (%) | Out gas (ng/cm²) | Decomposition temperature (° C.) |
| Example 1 | 90 | 16 | 10 | 350 |
| Example 2 | 85 | 16 | 5 | 355 |
| Example 3 | 88 | 11 | 1 | 370 |
| Example 4 | 89 | 17 | 11 | 340 |
| Example 5 | 87 | 15 | 5 | 335 |
| Example 6 | 91 | 12 | 2 | 367 |

TABLE 2-continued

|  | Exposure/ development | Curing at 250° C. | | |
| --- | --- | --- | --- | --- |
|  | Film residue ratio (%) | Film shrinkage ratio (%) | Out gas (ng/cm²) | Decomposition temperature (° C.) |
| Example 7 | 84 | 17 | 9 | 350 |
| Example 8 | 90 | 16 | 6 | 360 |
| Example 9 | 88 | 11 | 2 | 377 |
| Example 10 | 88 | 16 | 12 | 345 |
| Example 11 | 90 | 14 | 8 | 355 |
| Example 12 | 87 | 12 | 3 | 373 |
| Example 13 | 85 | 18 | 12 | 345 |
| Example 14 | 83 | 16 | 9 | 349 |
| Example 15 | 88 | 13 | 4 | 356 |
| Example 16 | 96 | 7 | 0 | 385 |
| Example 17 | 90 | 19 | 12 | 352 |
| Example 18 | 94 | 8 | 0 | 381 |
| Example 19 | 91 | 17 | 14 | 353 |
| Example 20 | 94 | 9 | 1 | 376 |
| Example 21 | 92 | 17 | 16 | 351 |
| Example 22 | 90 | 10 | 2 | 365 |
| Example 23 | 87 | 16 | 8 | 356 |
| Example 24 | 84 | 9 | 0 | 373 |
| Example 25 | 88 | 13 | 11 | 354 |
| Example 26 | 85 | 8 | 2 | 369 |
| Example 27 | 87 | 13 | 18 | 355 |
| Example 28 | 91 | 10 | 4 | 366 |
| Example 29 | 93 | 19 | 14 | 345 |
| Example 30 | 88 | 13 | 6 | 362 |
| Example 31 | 87 | 15 | 9 | 350 |
| Example 32 | 82 | 7 | 2 | 381 |
| Example 33 | 84 | 15 | 18 | 339 |
| Example 34 | 89 | 11 | 5 | 358 |
| Example 35 | 86 | 13 | 12 | 346 |
| Example 36 | 84 | 9 | 4 | 373 |
| Example 37 | 88 | 18 | 18 | 355 |
| Example 38 | 82 | 9 | 2 | 380 |
| Example 39 | 89 | 16 | 15 | 346 |
| Example 40 | 87 | 11 | 4 | 361 |
| Example 41 | 90 | 19 | 11 | 349 |
| Example 42 | 91 | 9 | 3 | 378 |
| Comparative Example 1 | 77 | 27 | 350 | 300 |
| Comparative Example 2 | 84 | 31 | 360 | 295 |
| Comparative Example 3 | 82 | 41 | 365 | 290 |
| Comparative Example 4 | 68 | 38 | 300 | 290 |
| Comparative Example 5 | 66 | 39 | 315 | 295 |
| Comparative Example 6 | 55 | 33 | 250 | 316 |
| Comparative Example 7 | 62 | 32 | 299 | 300 |
| Comparative Example 8 | 50 | 36 | 230 | 319 |
| Comparative Example 9 | 77 | 30 | 360 | 316 |
| Comparative Example 10 | 74 | 20 | 260 | 320 |
| Comparative Example 11 | 66 | 31 | 378 | 276 |
| Comparative Example 12 | 82 | 29 | 400 | 285 |
| Comparative Example 13 | 86 | 46 | 950 | 240 |
| Comparative Example 14 | 84 | 45 | 900 | 230 |
| Comparative Example 15 | 87 | 46 | 800 | 240 |
| Comparative Example 16 | 83 | 49 | 850 | 250 |
| Comparative Example 17 | 84 | 50 | 860 | 255 |

As shown in Table 2, the positive photosensitive resin compositions according to Examples 1 to 42 exhibit largely decreased out gas amount film and remarkably improved residue ratio and film shrinkage ratio compared with the compositions according to Comparative Examples 1 to 17.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A positive photosensitive resin composition, comprising:
    (A) an alkali soluble resin;
    (B) a photosensitive diazoquinone compound;
    (C) a cross-linking agent;
    (D) a thermal acid generator;
    (E) a phenol compound; and
    (F) an organic solvent,
    wherein the cross-linking agent and thermal acid generator are included in a weight ratio of about 5:20 to about 20:5, and
    wherein the thermal acid generator comprises one or more compounds represented by the following Chemical Formulae 45 to 48:

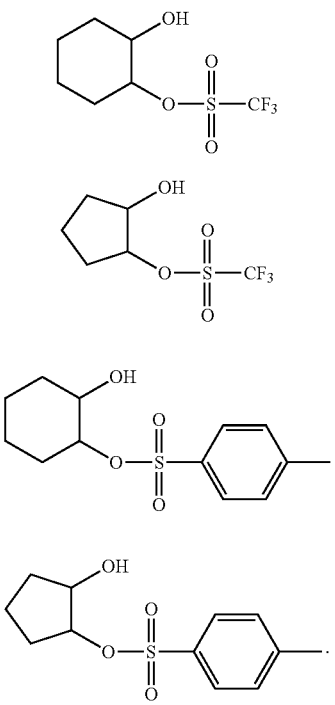

[Chemical Formula 45]

[Chemical Formula 46]

[Chemical Formula 47]

[Chemical Formula 48]

2. The positive photosensitive resin composition of claim 1, wherein the cross-linking agent is a melamine-based cross-linking agent, a methylol-based cross-linking agent, or a combination thereof.

3. The positive photosensitive resin composition of claim 1, wherein the alkali soluble resin is a polybenzoxazole precursor, a polyimide precursor, or a combination thereof.

4. The positive photosensitive resin composition of claim 3, wherein the polybenzoxazole precursor comprises a structure unit represented by the following Chemical Formula 1, and the polyimide precursor comprises a structure unit represented by the following Chemical Formula 2:

[Chemical Formula 1]

[Chemical Formula 2]

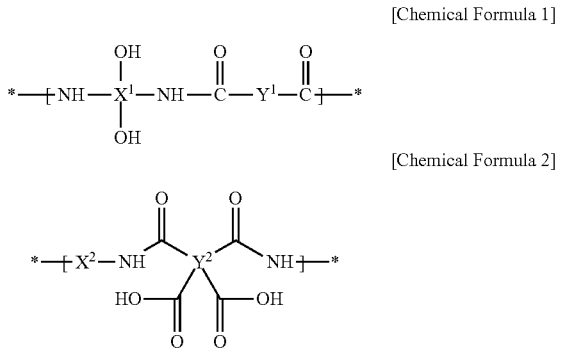

wherein, in the above Chemical Formulae 1 and 2, each $X^1$ is the same or different and each is independently a substituted or unsubstituted C6 to C30 aromatic organic group, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

5. The positive photosensitive resin composition of claim 1, wherein the thermal acid generator has a decomposition temperature of about 120° C. to about 200° C.

6. The positive photosensitive resin composition of claim 1, wherein the positive photosensitive resin composition comprises:

about 5 to about 100 parts by weight of the photosensitive diazoquinone compound (B);

about 1 to about 50 parts by weight of the cross-linking agent (C);

about 1 to about 50 parts by weight of the thermal acid generator (D); and about 1 to about 50 parts by weight of the phenol compound (E), each based on about 100 parts by weight of the alkali soluble resin (A), and about 3 to about 30 wt % of the organic solvent (F) based on the total solid amount of the positive photosensitive resin composition.

7. The positive photosensitive resin composition of claim 1, further comprising a surfactant, a leveling agent, a silane coupling agent, or a combination thereof.

8. A photosensitive resin film manufactured using the positive photosensitive resin composition of claim 1.

9. A display device comprising the photosensitive resin film of claim 8.

* * * * *